(12) United States Patent
Uchida et al.

(10) Patent No.: US 10,497,654 B2
(45) Date of Patent: Dec. 3, 2019

(54) SEMICONDUCTOR DEVICE

(71) Applicant: Renesas Electronics Corporation, Tokyo (JP)

(72) Inventors: Shinichi Uchida, Tokyo (JP); Yasutaka Nakashiba, Ibaraki (JP)

(73) Assignee: Renesas Electronics Corporation, Tokyo (JP)

( * ) Notice: Subject to any disclaimer, the term of this patent is extended or adjusted under 35 U.S.C. 154(b) by 146 days.

(21) Appl. No.: 15/635,425

(22) Filed: Jun. 28, 2017

(65) Prior Publication Data

US 2018/0047680 A1 Feb. 15, 2018

(30) Foreign Application Priority Data

Aug. 12, 2016 (JP) .................. 2016-158687

(51) Int. Cl.

| H01L 23/58 | (2006.01) |
|---|---|
| H01L 21/84 | (2006.01) |
| H01L 23/522 | (2006.01) |
| H01L 23/528 | (2006.01) |
| H01L 23/535 | (2006.01) |
| H01L 23/00 | (2006.01) |
| H01L 27/12 | (2006.01) |
| H01L 29/06 | (2006.01) |
| H01L 29/10 | (2006.01) |

(52) U.S. Cl.
CPC ............ *H01L 23/585* (2013.01); *H01L 21/84* (2013.01); *H01L 23/528* (2013.01); *H01L 23/5226* (2013.01); *H01L 23/535* (2013.01); *H01L 23/564* (2013.01); *H01L 27/1203* (2013.01); *H01L 27/1207* (2013.01); *H01L 29/0649* (2013.01); *H01L 29/1095* (2013.01)

(58) Field of Classification Search
CPC . H01L 23/5226; H01L 23/528; H01L 23/585; H01L 23/564; H01L 21/84; H01L 27/1203; H01L 29/0649; H01L 29/1095
USPC ........................................................ 257/508
See application file for complete search history.

(56) References Cited

U.S. PATENT DOCUMENTS

| 2006/0102980 A1* | 5/2006 | Nakashiba ...... H01L 21/823878 257/508 |
|---|---|---|
| 2008/0061397 A1 | 3/2008 | Uchida |
| 2009/0096036 A1* | 4/2009 | Ishigaki .......... H01L 21/823418 257/392 |

(Continued)

FOREIGN PATENT DOCUMENTS

| JP | 4689244 B2 | 5/2011 |
|---|---|---|
| JP | 2014236159 A | 12/2014 |
| JP | 2015099819 A | 5/2015 |

OTHER PUBLICATIONS

Extended European Search Report received in corresponding European Application No. 17184671.0 dated Jan. 3, 2018.

(Continued)

*Primary Examiner* — Daniel Whalen
(74) *Attorney, Agent, or Firm* — Mattingly & Malur, PC

(57) ABSTRACT

A semiconductor device includes an annular seal ring formed in a seal ring region surrounding a circuit forming region. The seal ring includes a BOX layer, an n-type semiconductor layer, and an annular electrode portion comprised of multiple layers of wirings. The electrode portion is electrically connected with the n-type semiconductor layer through a plug electrode.

14 Claims, 19 Drawing Sheets

(56) References Cited

U.S. PATENT DOCUMENTS

| | | |
|---|---|---|
| 2010/0012950 A1 | 1/2010 | Liu et al. |
| 2010/0200958 A1* | 8/2010 | Angyal ................ H01L 23/562 257/619 |
| 2010/0314727 A1 | 12/2010 | Uchida et al. |
| 2012/0313217 A1* | 12/2012 | Hung .................... H01L 23/585 257/532 |
| 2014/0353746 A1 | 12/2014 | Hamazawa |

OTHER PUBLICATIONS

Japanese Office Action issued in corresponding Japanese Application No. 2016-158687 dated Oct. 8, 2019.

* cited by examiner

SEMICONDUCTOR DEVICE

CROSS-REFERENCE TO RELATED APPLICATION

The present application claims priority from Japanese Patent Application No. 2016-158687 filed on Aug. 12, 2016, the content of which is hereby incorporated by reference into this application.

TECHNICAL FIELD OF THE INVENTION

The present invention relates to a semiconductor device and can be suitably used, for example, in a semiconductor device in which a silicon-on-insulator (SOI) substrate is used.

BACKGROUND OF THE INVENTION

Japanese Patent No. 4689244 (Patent Document 1) discloses a semiconductor device including an annular seal ring surrounding a logic unit and an outer periphery of an analog unit, and the semiconductor device is provided with a pn junction portion functioning as a non-conductive portion blocking conduction of a path from the logic unit to the analog unit through the seal ring, in a seal ring region.

SUMMARY OF THE INVENTION

A protective structure called a seal ring comprised of multiple layers of wirings is disposed near an edge portion of a semiconductor chip to prevent chipping of the semiconductor chip and to improve moisture resistance of the semiconductor chip. However, since the seal ring has very low impedance, when noise is applied to the seal ring, propagation of the noise to the entire semiconductor chip is caused.

Other objects and novel characteristics of the present invention will be apparent from the description of the present specification and the accompanying drawings.

A semiconductor device according to one embodiment includes a circuit forming region, a seal ring region surrounding an outer periphery of the circuit forming region, and an annular seal ring formed in the seal ring region. The seal ring region includes: an SOI substrate comprised of a semiconductor substrate, a BOX layer over the semiconductor substrate, and a semiconductor layer over the BOX layer; and an interlayer insulating film formed over the semiconductor layer. The seal ring includes: an annular electrode portion comprised of a conductive film buried in the interlayer insulating film; a semiconductor layer; and a BOX layer. The electrode portion is electrically connected with the semiconductor layer.

According to one embodiment, it is possible to suppress propagation of noise through the seal ring in the semiconductor device in which the SOI substrate is used.

BRIEF DESCRIPTIONS OF THE DRAWINGS

DESCRIPTIONS OF THE PREFERRED EMBODIMENTS

Figure 1:
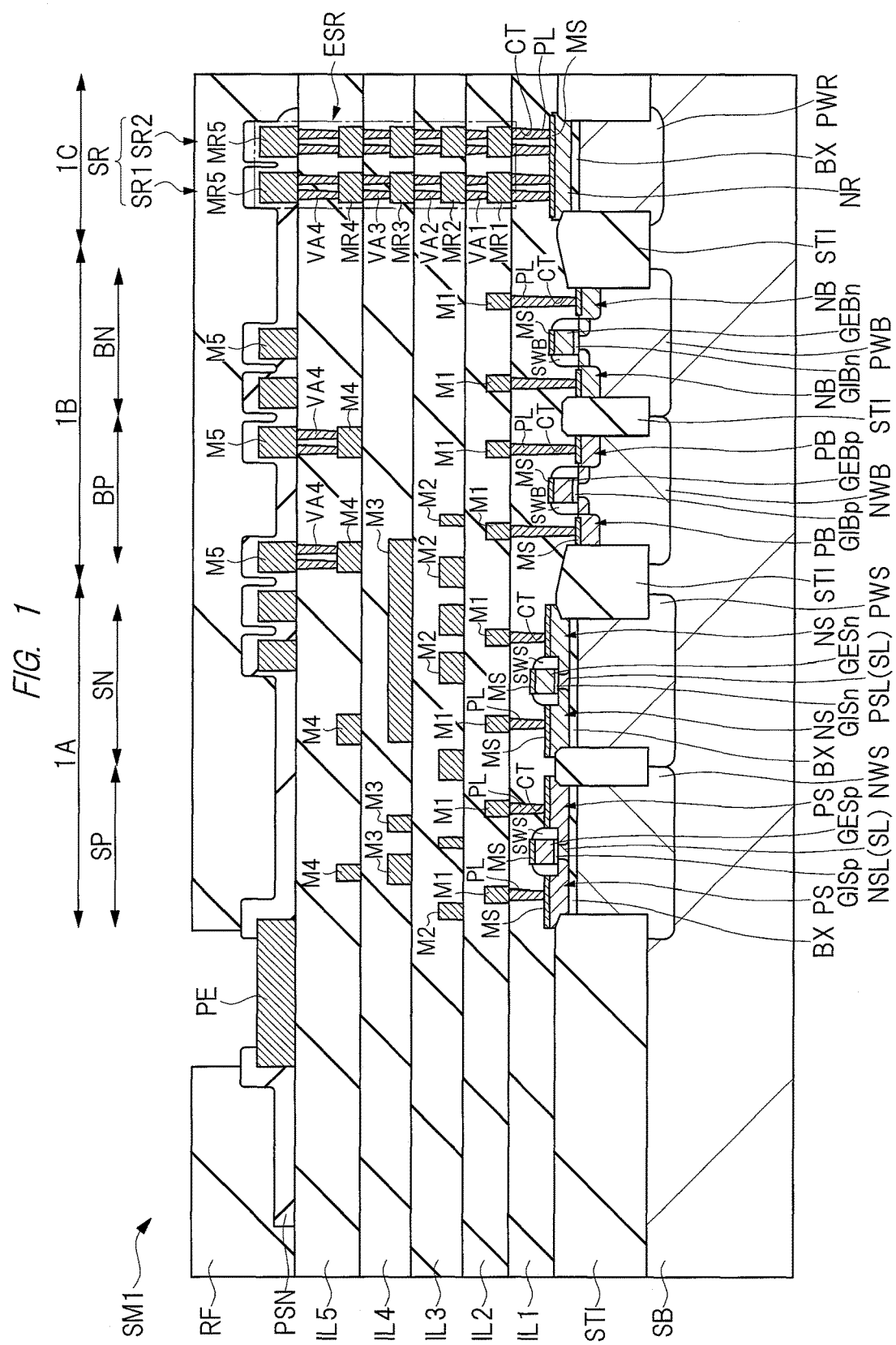
FIG. 1 is a cross-sectional view illustrating a semiconductor device according to a first embodiment.

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (including element steps) are not always indispensable unless otherwise stated or except the case where the components are apparently indispensable in principle.

Also, even when mentioning that constituent elements or the like are "made of A," "made up of A," "having A," or "including A" in the embodiments below, elements other than A are of course not excluded except the case where it is particularly specified that A is the only element thereof. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the value and the range described above.

Also, components having the same function are, in principle, denoted by the same reference characters throughout the drawings for describing the embodiments below, and the repetitive description thereof is omitted. Also, in cross-sectional views and plan views, a size of each portion does not correspond to that of an actual device, and a specific portion is shown relatively largely so as to make the drawings easy to see, in some cases. Moreover, even when a plan view corresponds to a cross-sectional view, a specific portion is shown relatively largely so as to make the drawings easy to see, in some cases. In addition, hatching may be omitted even in a cross-sectional view so as to make the drawings easy to see. Also, hatching may be used even in a plan view so as to make the drawings easy to see.

Hereinafter, embodiments of the present invention will be described in detail with reference to the accompanying drawings.

First Embodiment

<Configuration of Semiconductor Device>

A configuration of a semiconductor device according to a first embodiment will be described with reference to FIG. 1. FIG. 1 is a cross-sectional view illustrating the semiconductor device according to the first embodiment and exemplifies a silicon on insulator (SOI) transistor and a bulk transistor which are formed in a circuit forming region of the semiconductor device as well as an annular seal ring formed in a seal ring region surrounding the circuit forming region.

In the first embodiment, an SOI region 1A is a region in which the SOI transistor (an n-channel type SOI transistor SN and a p-channel type SOI transistor SP) having a metal oxide semiconductor (MOS) structure is formed, and a bulk region 1B is a region in which the bulk transistor (an n-channel type bulk transistor BN and a p-channel type bulk transistor BP) having the MOS structure is formed. Furthermore, a seal ring region 1C is a region in which a seal ring SR is formed. Also, in the first embodiment, a semiconductor device SM1 has five layers of wirings; however, the number of layers is not limited to five.

(1) Configuration of SOI Transistor

In descriptions below, an n-channel type SOI transistor having the MOS structure is abbreviated as an n-type SOI transistor, and a p-channel type SOI transistor having the MOS structure is abbreviated as a p-type SOI transistor.

The n-type SOI transistor SN and the p-type SOI transistor SP are formed in a principal surface of an SOI substrate comprised of a semiconductor substrate SB made of p-type single crystal silicon, a buried oxide (BOX) layer (also referred to as a buried insulation layer) BX made of silicon oxide, for example, and formed over the semiconductor substrate SB, and a semiconductor layer (also referred to as an SOI layer or a silicon layer) SL made of single crystal silicon and formed over the BOX layer BX. A thickness of the BOX layer BX is substantially 10 to 20 nm, for example, and a thickness of the semiconductor layer SL is substantially 10 to 20 nm, for example.

First, the n-type SOI transistor SN will be described. The n-type SOI transistor SN is isolated (insulated) from an adjacent element forming region (also referred to as an active region) by an element isolation portion STI formed in the semiconductor substrate SB. In the semiconductor substrate SB where the n-type SOI transistor SN is formed, a p-type well PWS is formed. Also, in the semiconductor layer SL where the n-type SOI transistor SN is formed, a p-type impurity is introduced, and a p-type semiconductor layer PSL is formed.

A gate insulating film GISn is formed over the p-type semiconductor layer PSL, and a gate electrode GESn is formed over the gate insulating film GISn. The gate insulating film GISn is made of silicon oxide or silicon oxynitride, for example, and the gate electrode GESn is made of polycrystalline silicon, for example. The p-type semiconductor layer PSL below the gate electrode GESn serves as a channel of the n-type SOI transistor SN.

A sidewall spacer SWS made of an insulating material is formed over each side wall of the gate electrode GESn. In a region of the p-type semiconductor layer PSL not covered with the gate electrode GESn and the sidewall spacer SWS, an epitaxial layer is selectively formed, although illustration thereof is omitted.

In the p-type semiconductor layer PSL on both sides of the gate electrode GESn (both sides in a gate length direction) and in the epitaxial layer, n-type conductive source/drain semiconductor regions NS of the n-type SOI transistor SN are formed.

Over each of an upper portion of the gate electrode GESn and an upper portion (surface layer portion) of the source/drain semiconductor regions NS, a silicide layer MS, which is a reaction layer (compound layer) of a metal and a semiconductor, is formed.

Over the SOI substrate, a first interlayer insulating film IL1 is formed so as to cover the gate electrode GESn, the sidewall spacer SWS, the silicide layer MS, and the like. On the first interlayer insulating film IL1, a first layer wiring M1 is formed. The wiring M1 is electrically connected with the gate electrode GESn, the source/drain semiconductor regions NS, and the like by a plug electrode PL buried inside a connection hole CT formed in the first interlayer insulating film IL1. The wiring M1 is made of copper, aluminum, and the like, for example, and the plug electrode PL is made of tungsten and the like, for example.

Above the wiring M1, a second layer wiring M2, a third layer wiring M3, a fourth layer wiring M4, and a fifth layer wiring M5 are formed interposing a second interlayer insulating film IL2, a third interlayer insulating film IL3, a fourth interlayer insulating film IL4, and a fifth interlayer insulating film IL5, respectively. Moreover, the wiring M5 of the uppermost layer is covered with an insulating film PSN and a protection film RF. The insulating film PSN is made of silicon nitride and the like, for example, and the protection film RF is made of photosensitive polyimide and the like, for example.

Next, the p-type SOI transistor SP will be described. The p-type SOI transistor SP is isolated from an adjacent element forming region by the element isolation portion STI formed in the semiconductor substrate SB. In the semiconductor substrate SB where the p-type SOI transistor SP is formed, an n-type well NWS is formed. Also, in the semiconductor layer SL where the p-type SOI transistor SP is formed, an n-type impurity is introduced, and an n-type semiconductor layer NSL is formed.

A gate insulating film GISp is formed over the n-type semiconductor layer NSL, and a gate electrode GESp is formed over the gate insulating film GISp. The gate insulating film GISp is made of silicon oxide or silicon oxynitride, for example, and the gate electrode GESp is made of polycrystalline silicon, for example. The n-type semiconductor layer NSL below the gate electrode GESp serves as a channel of the p-type SOI transistor SP.

A sidewall spacer SWS made of an insulating material is formed over each side wall of the gate electrode GESp. In a region of the n-type semiconductor layer NSL not covered with the gate electrode GESp and the sidewall spacer SWS, an epitaxial layer is selectively formed, although illustration thereof is omitted.

In the n-type semiconductor layer NSL on both sides of the gate electrode GESp (both sides in a gate length direction) and in the epitaxial layer, p-type conductive source/drain semiconductor regions PS of the p-type SOI transistor SP are formed.

Over each of an upper portion of the gate electrode GESp and an upper portion (surface layer portion) of the source/drain semiconductor regions PS, the silicide layer MS, which is the reaction layer of the metal and the semiconductor, is formed.

Over the SOI substrate, similarly to the n-type SOI transistor SN described above, the first interlayer insulating film IL1 is formed so as to cover the gate electrode GESp, the sidewall spacer SWS, the silicide layer MS, and the like. Furthermore, the second interlayer insulating film IL2 to the fifth interlayer insulating film IL5 and the first layer wiring M1 to the fifth layer wiring M5 are formed, and the wiring M5 of the uppermost layer is covered with the insulating film PSN and the protection film RF.

(2) Configuration of Bulk Transistor

In descriptions below, an n-channel type bulk transistor having the MOS structure is abbreviated as an n-type bulk transistor, and a p-channel type bulk transistor having the MOS structure is abbreviated as a p-type bulk transistor.

The n-type bulk transistor BN and the p-type bulk transistor BP are formed in the principal surface of the semiconductor substrate SB made of p-type single crystal silicon.

First, the n-type bulk transistor BN will be described. The n-type bulk transistor BN is isolated from an adjacent element forming region by the element isolation portion STI formed in the semiconductor substrate SB. In the semiconductor substrate SB where the n-type bulk transistor BN is formed, a p-type well PWB is formed.

A gate insulating film GIBn is formed over the semiconductor substrate SB (p-type well PWB), and a gate electrode GEBn is formed over the gate insulating film GIBn. The gate insulating film GIBn is made of silicon oxide or silicon oxynitride, for example, and the gate electrode GEBn is made of polycrystalline silicon, for example. The semiconductor substrate SB below the gate electrode GEBn serves as a channel of the n-type bulk transistor BN.

A sidewall spacer SWB made of an insulating material is formed over each side wall of the gate electrode GEBn.

In the semiconductor substrate SB on both sides of the gate electrode GEBn (both sides in a gate length direction), n-type conductive source/drain semiconductor regions NB of the n-type bulk transistor BN are formed. The source/drain semiconductor regions NB have a so-called lightly doped drain (LDD) structure comprised of an n-type extension layer having a relatively low concentration and an n-type diffusion layer having a relatively high concentration.

Over each of an upper portion of the gate electrode GEBn and an upper portion (surface layer portion) of the source/drain semiconductor regions NB, the silicide layer MS, which is the reaction layer of the metal and the semiconductor, is formed.

Over the semiconductor substrate SB, similarly to the n-type SOI transistor SN described above, the first interlayer insulating film IL1 is formed so as to cover the gate electrode GEBn, the sidewall spacer SWB, the silicide layer MS, and the like. Furthermore, the second interlayer insulating film IL2 to the fifth interlayer insulating film IL5 and the first layer wiring M1 to the fifth layer wiring M5 are formed, and the wiring M5 of the uppermost layer is covered with the insulating film PSN and the protection film RF.

Next, the p-type bulk transistor BP will be described. The p-type bulk transistor BP is isolated from an adjacent element forming region by the element isolation portion STI formed in the semiconductor substrate SB. In the semiconductor substrate SB where the p-type bulk transistor BP is formed, an n-type well NWB is formed.

A gate insulating film GIBp is formed over the semiconductor substrate SB (n-type well NWB), and a gate electrode GEBp is formed over the gate insulating film GIBp. The gate insulating film GIBp is made of silicon oxide or silicon oxynitride, for example, and the gate electrode GEBp is made of polycrystalline silicon, for example. The semiconductor substrate SB below the gate electrode GEBp serves as a channel of the p-type bulk transistor BP.

The sidewall spacer SWB made of the insulating material is formed over each side wall of the gate electrode GEBp.

In the semiconductor substrate SB on both sides of the gate electrode GEBp (both sides in a gate length direction), p-type conductive source/drain semiconductor regions PB of the p-type bulk transistor BP are formed. The source/drain semiconductor regions PB have the so-called LDD structure comprised of a p-type extension layer having a relatively low concentration and a p-type diffusion layer having a relatively high concentration.

Over each of an upper portion of the gate electrode GEBp and an upper portion (surface layer portion) of the source/drain semiconductor regions PB, the silicide layer MS, which is the reaction layer of the metal and the semiconductor, is formed.

Over the semiconductor substrate SB, similarly to the n-type SOI transistor SN described above, the first interlayer insulating film IL1 is formed so as to cover the gate electrode GEBp, the sidewall spacer SWB, the silicide layer MS, and the like. Furthermore, the second interlayer insulating film IL2 to the fifth interlayer insulating film IL5 and the first layer wiring M1 to the fifth layer wiring M5 are formed, and the wiring M5 of the uppermost layer is covered with the insulating film PSN and the protection film RF.

(3) Configuration of Seal Ring

The seal ring SR is comprised of the BOX layer BX formed over the semiconductor substrate SB made of the p-type single crystal silicon, an n-type semiconductor layer NR made of n-type single crystal silicon and is formed over the BOX layer BX, and an electrode portion ESR electrically connected with the n-type semiconductor layer NR through the silicide layer MS formed over an upper portion (surface layer portion) of the n-type semiconductor layer NR.

In the semiconductor substrate SB, a p-type well PWR having a predetermined depth from the principal surface thereof is formed. An impurity concentration of the p-type well PWR is set to be higher than an impurity concentration of the semiconductor substrate SB.

The BOX layer BX and the n-type semiconductor layer NR are isolated from an adjacent element forming region by the element isolation portion STI formed in the semiconductor substrate SB. A thickness of the BOX layer BX is substantially 10 to 20 nm, for example, and a thickness of the n-type semiconductor layer NR is substantially 10 to 20 nm, for example.

The electrode portion ESR is formed so as to surround the circuit forming region, and it has a structure in which a first layer wiring MR1 to a fifth layer wiring MR5 are electrically connected in order from lower to higher layers.

Hereinafter, a configuration of the electrode portion ESR will be specifically described.

The first interlayer insulating film IL1 is formed so as to cover the silicide layer MS. On the first interlayer insulating film IL1, the annular first layer wiring MR1 dually surrounding the circuit forming region is formed. The annular wiring MR1 disposed inside (on a circuit forming region side) and the annular wiring MR1 disposed outside (on an opposite side of the circuit forming region) are electrically connected with the silicide layer MS by the plug electrode PL buried inside the connection hole CT formed in the first interlayer insulating film IL1. The wiring MR1 is the same layer as the wiring M1 formed in the circuit forming region.

Moreover, the annular wiring MR1 dually surrounding the circuit forming region is covered with the second interlayer insulating film IL2, and on the second interlayer insulating film IL2, the annular second layer wiring MR2 dually surrounding the circuit forming region is formed. The annular wiring MR2 disposed inside and the annular wiring MR2 disposed outside are electrically connected with the annular wiring MR1 disposed inside and the annular wiring MR1 disposed outside, respectively, through a first conductive film VA1 buried inside a via hole formed in the second interlayer insulating film IL2. The wiring MR2 is the same layer as the wiring M2 formed in the circuit forming region.

Similarly, the annular wiring MR2 dually surrounding the circuit forming region is covered with the third interlayer insulating film IL3, and on the third interlayer insulating film IL3, the annular third layer wiring MR3 dually surrounding the circuit forming region is formed. The annular wiring MR3 disposed inside and the annular wiring MR3 disposed outside are electrically connected with the annular wiring MR2 disposed inside and the annular wiring MR2 disposed outside, respectively, through a second conductive film VA2 buried inside a via hole formed in the third interlayer insulating film IL3. The wiring MR3 is the same layer as the wiring M3 formed in the circuit forming region.

Similarly, the annular wiring MR3 dually surrounding the circuit forming region is covered with the fourth interlayer insulating film IL4, and on the fourth interlayer insulating film IL4, the annular fourth layer wiring MR4 dually surrounding the circuit forming region is formed. The annular wiring MR4 disposed inside and the annular wiring MR4 disposed outside are electrically connected with the annular wiring MR3 disposed inside and the annular wiring MR3 disposed outside, respectively, through a third conductive film VA3 buried inside a via hole formed in the fourth interlayer insulating film IL4. The wiring MR4 is the same layer as the wiring M4 formed in the circuit forming region.

Similarly, the annular wiring MR4 dually surrounding the circuit forming region is covered with the fifth interlayer insulating film IL5, and on the fifth interlayer insulating film IL5, the annular fifth layer wiring MR5 dually surrounding the circuit forming region is formed. The annular wiring MR5 disposed inside and the annular wiring MR5 disposed outside are electrically connected with the annular wiring MR4 disposed inside and the annular wiring MR4 disposed outside, respectively, through a fourth conductive film VA4 buried inside a via hole formed in the fifth interlayer insulating film IL5. The wiring MR5 is the same layer as the wiring M5 formed in the circuit forming region. The wiring MR5 of the uppermost layer is covered with the insulating film PSN and the protection film RF.

Thus, the wirings MR1, MR2, MR3, MR4, and MR5 disposed inside are electrically connected with one another, and an annular first seal ring electrode SR1 is comprised of the wirings MR1, MR2, MR3, MR4, and MR5. The wirings MR1, MR2, MR3, MR4, and MR5 disposed outside are electrically connected with one another, and an annular second seal ring electrode SR2 is comprised of the wirings MR1, MR2, MR3, MR4, and MR5. That is, the electrode portion ESR is comprised of the first seal ring electrode SR1 and the second seal ring electrode SR2. The electrode portion ESR comprised of the first seal ring electrode SR1 and the second seal ring electrode SR2 is electrically connected with the n-type semiconductor layer NR through the silicide layer MS and the plug electrode PL.

Note that, in the first embodiment, the electrode portion ESR of the seal ring SR has a structure in which the circuit forming region is dually surrounded by the annular first seal ring electrode SR1 and the annular second seal ring electrode SR2; however, the structure thereof is not limited to this. It may also have a structure in which, for example, the circuit forming region is triply surrounded.

(4) Characteristics and Effects of Seal Ring

In the seal ring SR according to the first embodiment, as described above, the electrode portion ESR comprised of the first seal ring electrode SR1 and the second seal ring electrode SR2 is electrically connected with the n-type semiconductor layer NR through the silicide layer MS and the plug electrode PL. The n-type semiconductor layer NR is formed over the BOX layer BX. Thus, between the electrode portion ESR comprised of the first seal ring electrode SR1 and the second seal ring electrode SR2, and the p-type semiconductor substrate SB, there are the n-type semiconductor layer NR, the BOX layer BX, and the p-type well PWR.

Accordingly, capacitance comprised of the n-type semiconductor layer NR, the BOX layer BX, and the p-type well PWR is serially connected between the electrode portion ESR of the seal ring SR and the semiconductor substrate SB, and impedance between the electrode portion ESR and the semiconductor substrate SB becomes larger, whereby it is possible to suppress propagation of noise applied to the electrode portion ESR of the seal ring SR to the semiconductor substrate SB.

In the semiconductor device according to Patent Document 1 described above, there are two pn junction portions between a guard ring (corresponding to the electrode portion ESR of the seal ring SR of the first embodiment) and a p-type semiconductor substrate. By forming a carrier depletion layer near a junction interface of these pn junction portions and by generating capacitance, impedance is increased. Although it is possible to suppress noise by forming the pn junction portions in this way, impedance becomes small in a high frequency operation region, causing the noise to be picked up more easily. As a result, noise may be propagated.

In the seal ring SR according to the first embodiment, however, since the BOX layer BX is connected between the n-type semiconductor layer NR and the p-type well PWR, the impedance does not become small even in the high frequency operation region, whereby it is possible to suppress the propagation of noise.

<Method for Manufacturing Semiconductor Device>

A method for manufacturing the semiconductor device according to the first embodiment will be described with reference to FIGS. 2 to 6. FIGS. 2 to 6 are cross-sectional views illustrating manufacturing processes of the semiconductor device according to the first embodiment.

Figure 2:
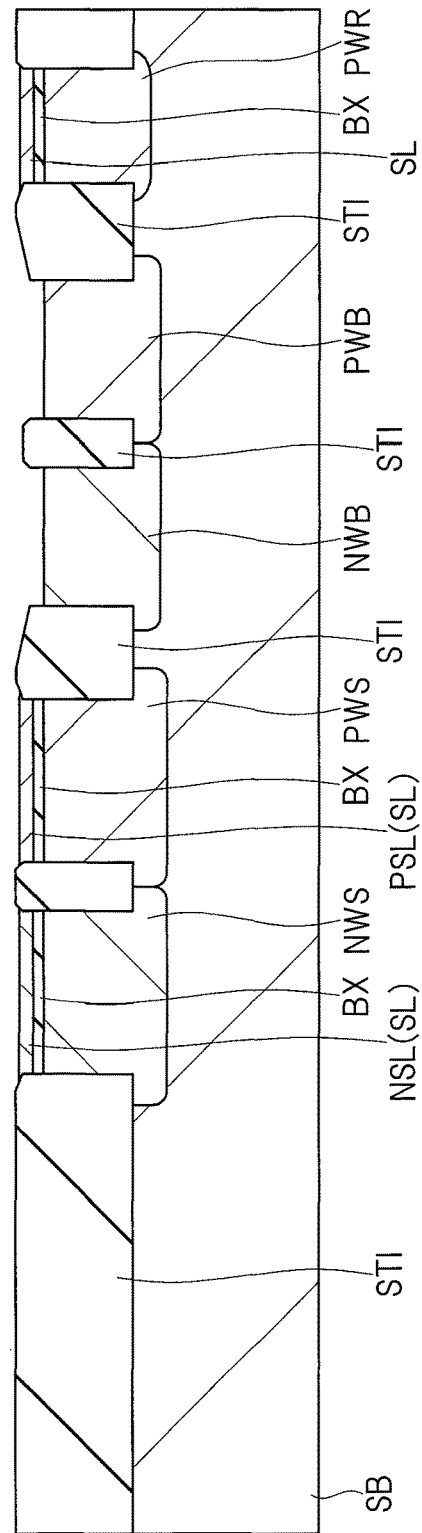
FIG. 2 is a cross-sectional view illustrating a manufacturing process of the semiconductor device according to the first embodiment.

First, as illustrated in FIG. 2, the SOI substrate comprised of the semiconductor substrate SB, the BOX layer BX formed over the semiconductor substrate SB, and the semiconductor layer SL formed over the BOX layer BX, is prepared. The semiconductor substrate SB is a supporting substrate made of single crystal silicon (Si). The BOX layer BX is made of silicon oxide. The semiconductor layer SL is made of single crystal silicon having a resistance of substantially 1 to 10 Ωcm. The thickness of the BOX layer BX is substantially 10 to 20 nm, for example, and the thickness of the semiconductor layer SL is substantially 10 to 20 nm, for example.

Next, the element isolation portion STI comprised of an insulating film and having a shallow trench isolation (STI) structure is formed in the SOI substrate. The element isolation portion STI is an inactive region isolating a plurality of active regions of the SOI substrate. That is, a shape of each of the active regions in a plan view is defined by being surrounded by the element isolation portion STI. Also, the plurality of element isolation portions STI are formed so as to isolate the SOI region 1A, the bulk region 1B, and the seal ring region 1C from one another. In each of the SOI region 1A and the bulk region 1B, the plurality of element isolation portions STI are formed so as to isolate the adjacent element forming regions.

Next, by implanting ions of a p-type impurity into the semiconductor substrate SB in the SOI region 1A where the n-type SOI transistor SN is formed, the p-type well PWS is selectively formed. At this time, although illustration is omitted, a threshold voltage control diffusion region of the n-type SOI transistor SN is formed. Similarly, by implanting ions of an n-type impurity into the semiconductor substrate SB in the SOI region 1A where the p-type SOI transistor SP is formed, the n-type well NWS is selectively formed. At this time, although illustration is omitted, a threshold voltage control diffusion region of the p-type SOI transistor SP is formed.

Next, by implanting ions of a p-type impurity into the semiconductor substrate SB in the bulk region 1B where the n-type bulk transistor BN is formed, the p-type well PWB is selectively formed. At this time, although illustration is omitted, a threshold voltage control diffusion region of the n-type bulk transistor BN is formed. Similarly, by implanting ions of an n-type impurity into the semiconductor substrate SB in the bulk region 1B where the p-type bulk transistor BP is formed, the n-type well NWB is selectively formed. At this time, although illustration is omitted, a threshold voltage control diffusion region of the p-type bulk transistor BP is formed.

Next, by implanting ions of a p-type impurity into the semiconductor substrate SB in the seal ring region 1C, the p-type well PWR is selectively formed.

Next, after a resist pattern is formed in the SOI region 1A and the seal ring region 1C, the semiconductor layer SL in the bulk region 1B is selectively removed by dry etching, for example, using the BOX layer BX as a stopper. Subsequently, the resist pattern is removed, and the BOX layer BX in the bulk region 1B is removed by hydrofluoric acid cleaning, for example.

In the SOI region 1A, the bulk region 1B, and the seal ring region 1C formed through the above-described process, a level difference is caused between a front surface of the semiconductor layer SL in the SOI region 1A and the seal ring region 1C and a front surface of the semiconductor substrate SB in the bulk region 1B. However, the level difference is substantially 20 nm, and any unprocessed part or disconnection in the level difference may be prevented in a subsequent manufacturing process. Thus, it is possible to form the SOI transistor and the bulk transistor in the same manufacturing process.

Next, by implanting ions of a p-type impurity into the semiconductor layer SL in the SOI region 1A where the n-type SOI transistor SN is formed, the p-type semiconductor layer PSL is selectively formed. Similarly, by implanting ions of an n-type impurity into the semiconductor layer SL in the SOI region 1A where the p-type SOI transistor SP is formed, the n-type semiconductor layer NSL is selectively formed.

Figure 3:
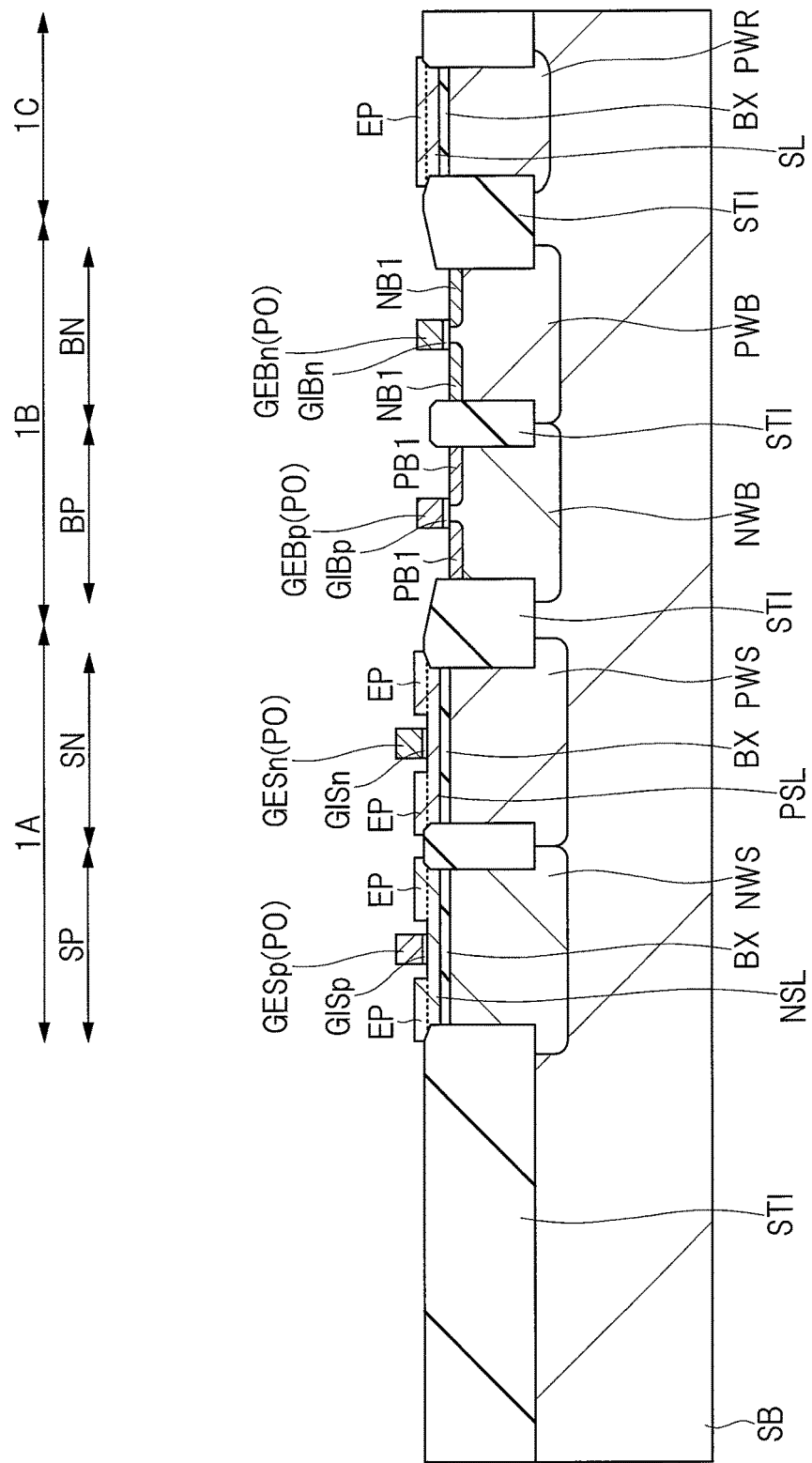
FIG. 3 is a cross-sectional view illustrating the manufacturing process of the semiconductor device continued from FIG. 2.

Next, as illustrated in FIG. 3, the gate insulating film GISn of the n-type SOI transistor SN and the gate insulating film GISp of the p-type SOI transistor SP are formed in the SOI region 1A, and the gate insulating film GIBn of the n-type bulk transistor BN and the gate insulating film GIBp of the p-type bulk transistor BP are formed in the bulk region 1B. Each thickness of the gate insulating films GISn and GISp is substantially 2 to 3 nm, for example, and each thickness of the gate insulating films GIBn and GIBp is substantially 7 to 8 nm, for example.

Subsequently, by the chemical vapor deposition (CVD), for example, a polycrystalline silicon film PO and a silicon nitride film (not illustrated) are layered in order over the gate insulating films GISn, GISp, GIBn, and GIBp. A thickness of the polycrystalline silicon film PO is substantially 40 nm, for example, and a thickness of the silicon nitride film is substantially 30 nm, for example.

Next, the silicon nitride film and the polycrystalline silicon film PO are processed in order by the anisotropy dry etching using the resist pattern as a mask. Accordingly, in the SOI region 1A, the gate electrode GESn of the n-type SOI transistor SN, comprised of the polycrystalline silicon film PO, is formed, and the gate electrode GESp of the p-type SOI transistor SP, comprised of the polycrystalline silicon film PO, is formed. At the same time, in the bulk region 1B, the gate electrode GEBn of the n-type bulk transistor BN, comprised of the polycrystalline silicon film PO, is formed, and the gate electrode GEBp of the p-type bulk transistor BP, comprised of the polycrystalline silicon film PO, is formed.

Next, ions of an n-type impurity such as arsenic (As) are implanted into the semiconductor substrate SB in a region where the n-type bulk transistor BN is formed in the bulk region 1B. Accordingly, an n-type extension layer NB1 of the n-type bulk transistor BN is formed in a self-alignment manner. At this time, it is also possible to form a p-type hollow region on a channel side of the n-type extension layer NB1. In the n-type bulk transistor BN, diffusion of the n-type extension layer NB1 in a channel direction may be suppressed by forming the p-type hollow region.

Next, ions of a p-type impurity such as boron fluoride ($BF_2$) are implanted into the semiconductor substrate SB in a region where the p-type bulk transistor BP is formed in the bulk region 1B. Accordingly, a p-type extension layer PB1 of the p-type bulk transistor BP is formed in a self-alignment manner. At this time, it is also possible to form an n-type hollow region on a channel side of the p-type extension layer PB1. In the p-type bulk transistor BP, diffusion of the p-type extension layer PB1 in a channel direction may be suppressed by forming the n-type hollow region.

Next, a side wall spacer (not illustrated) is formed on each of side walls of the gate electrode GESn of the n-type SOI transistor SN and side walls of the gate electrode GESp of the p-type SOI transistor SP. Subsequently, over the p-type semiconductor layer PSL and the n-type semiconductor layer NSL which are exposed in the SOI region 1A and over the semiconductor layer SL in the seal ring region 1C, a stacked single crystal layer of silicon (Si) or silicon germanium (SiGe), or an epitaxial layer EP, is selectively formed by the selective epitaxial growth method, for example.

Subsequently, the silicon nitride film over the side wall spacer and the gate electrodes GEBn, GEBp, GESn, and GESp is selectively removed.

Figure 4:
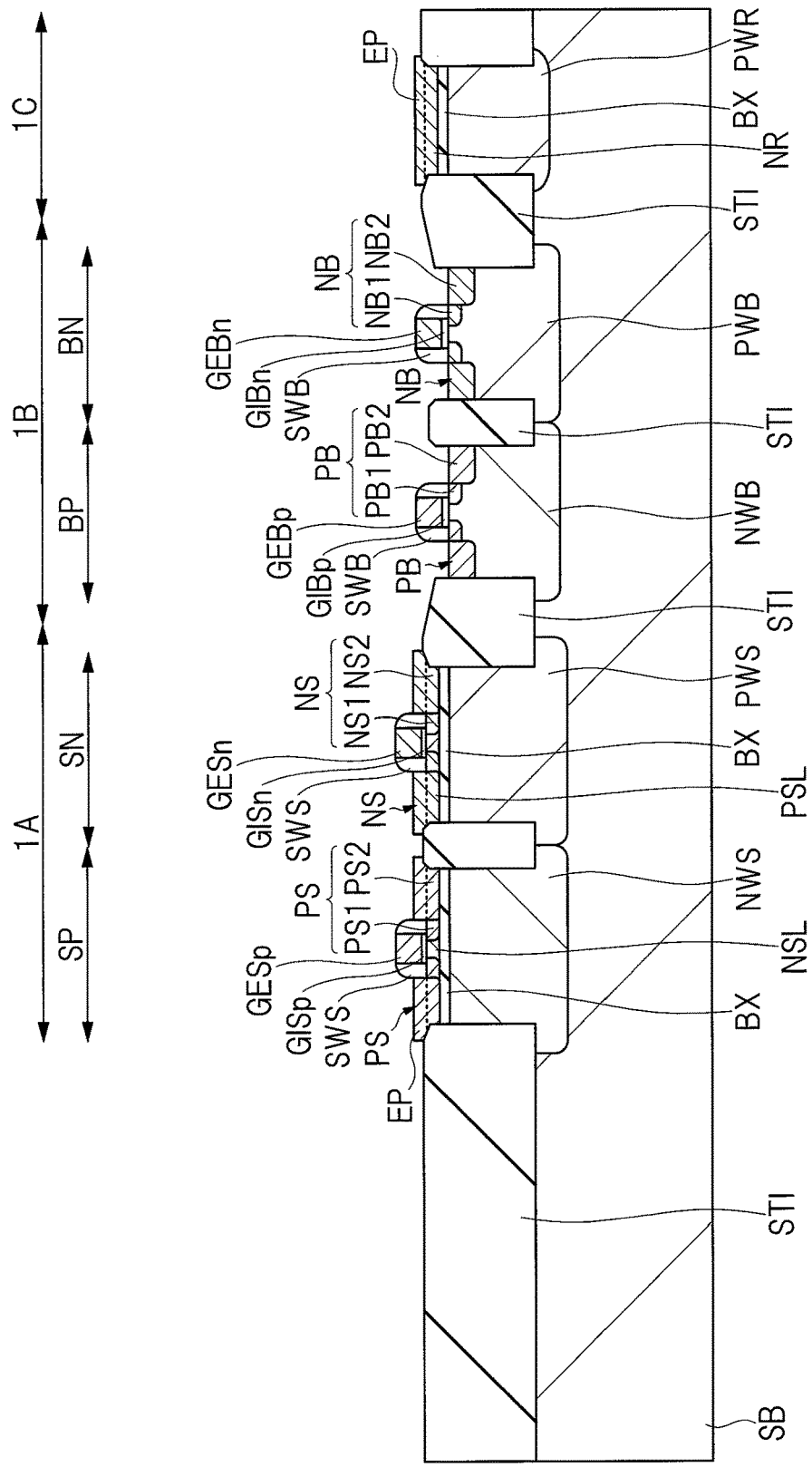
FIG. 4 is a cross-sectional view illustrating the manufacturing process of the semiconductor device continued from FIG. 3.

Next, as illustrated in FIG. 4, ions of an n-type impurity such as arsenic (As) are implanted into the p-type semiconductor layer PSL in a region where the n-type SOI transistor SN is formed in the SOI region 1A. Accordingly, an n-type extension layer NS1 of the n-type SOI transistor SN is formed in a self-alignment manner.

Next, ions of a p-type impurity such as boron fluoride ($BF_2$) are implanted into the n-type semiconductor layer NSL in a region where the p-type SOI transistor SP is formed in the SOI region 1A. Accordingly, a p-type extension layer PS1 of the p-type SOI transistor SP is formed in a self-alignment manner.

Next, the sidewall spacer SWS is formed over each of side walls of the gate electrode GESn of the n-type SOI transistor SN and side walls of the gate electrode GESp of the p-type SOI transistor SP, while the sidewall spacer SWB is formed over each of side walls of the gate electrode GEBn of the n-type bulk transistor BN and side walls of the gate electrode GEBp of the p-type bulk transistor BP.

Next, ions of an n-type impurity such as arsenic (As) are implanted into the SOI region 1A, the bulk region 1B, and the seal ring region 1C. Accordingly, an n-type diffusion layer NS2 of the n-type SOI transistor SN and an n-type diffusion layer NB2 of the n-type bulk transistor BN are formed in a self-alignment manner. That is, in the n-type SOI transistor SN, the n-type impurity is implanted into the epitaxial layer EP and the p-type semiconductor layer PSL below it to form the n-type diffusion layer NS2, and in the n-type bulk transistor BN, the n-type impurity is implanted into the semiconductor substrate SB to form the n-type diffusion layer NB2. At this time, the n-type impurity is not implanted into a channel region below the gate electrodes GESn and GEBn.

Accordingly, in the n-type SOI transistor SN, the source/drain semiconductor regions NS comprised of the n-type extension layer NS1 and the n-type diffusion layer NS2 are formed, and in the n-type bulk transistor BN, the source/drain semiconductor regions NB comprised of the n-type extension layer NB1 and the n-type diffusion layer NB2 are formed.

Furthermore, by this ion implantation, an n-type impurity is introduced into the semiconductor layer SL in the seal ring region 1C, whereby the n-type semiconductor layer NR is formed.

Next, ions of a p-type impurity such as boron fluoride ($BF_2$) are implanted into the SOI region 1A and the bulk region 1B. Accordingly, a p-type diffusion layer PS2 of the p-type SOI transistor SP and a p-type diffusion layer PB2 of the p-type bulk transistor BP are formed in a self-alignment manner. That is, in the p-type SOI transistor SP, the p-type impurity is implanted into the epitaxial layer EP and the n-type semiconductor layer NSL below it to form the p-type diffusion layer PS2, and in the p-type bulk transistor BP, the p-type impurity is implanted into the semiconductor substrate SB to form the p-type diffusion layer PB2. At this time, the p-type impurity is not implanted into a channel region below the gate electrodes GESp and GEBp.

Accordingly, in the p-type SOI transistor SP, the source/drain semiconductor regions PS comprised of the p-type extension layer PS1 and the p-type diffusion layer PS2 are formed, and in the p-type bulk transistor BP, the source/drain semiconductor regions PB comprised of the p-type extension layer PB1 and the p-type diffusion layer PB2 are formed.

Next, the impurities which have been ion-implanted are activated and thermally diffused by the rapid thermal annealing (RTA) method, for example.

Figure 5:
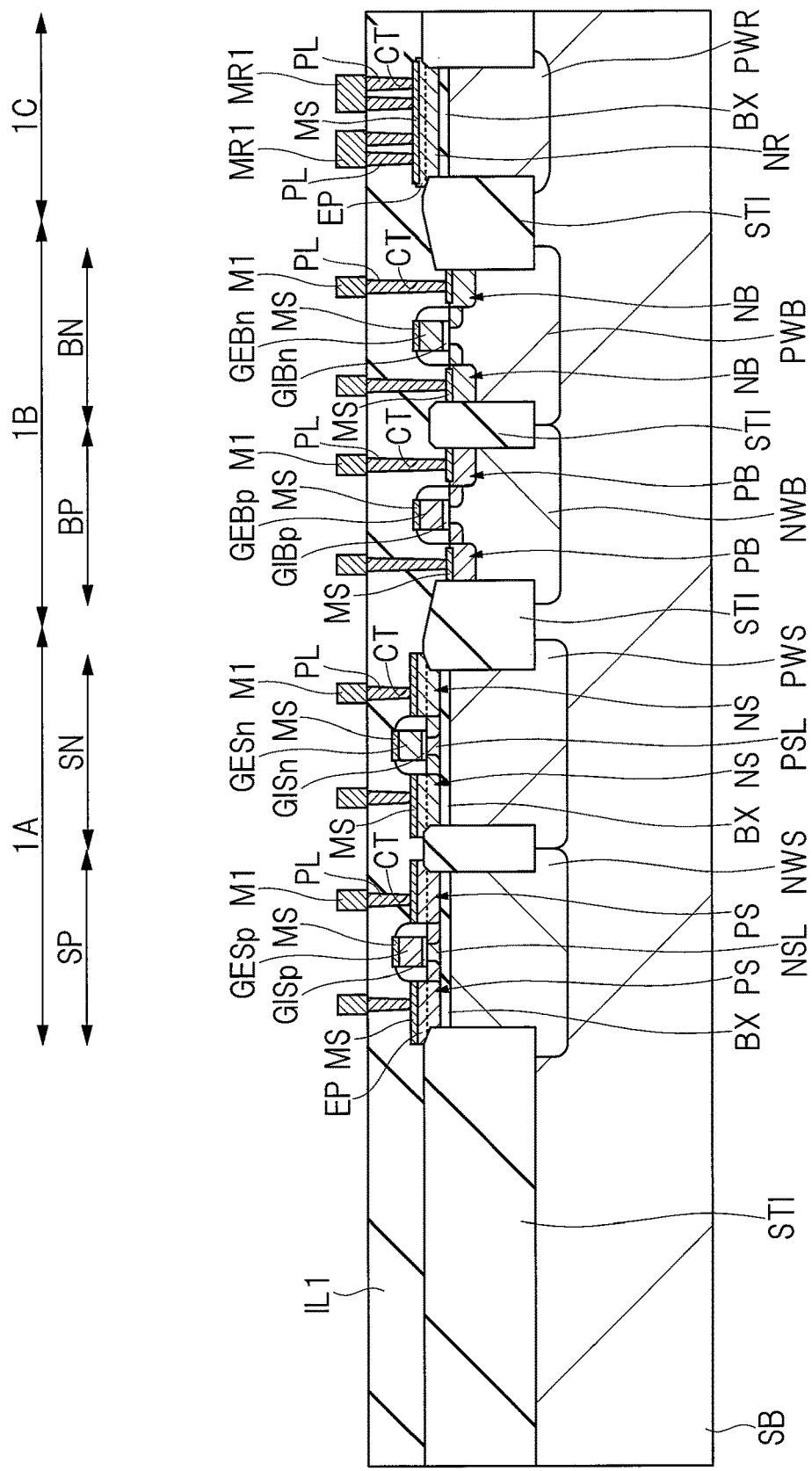
FIG. 5 is a cross-sectional view illustrating the manufacturing process of the semiconductor device continued from FIG. 4.

Next, as illustrated in FIG. 5, the silicide layer MS is formed. In the SOI region 1A, the silicide layer MS is formed over an upper portion of each of the gate electrode GESn and the source/drain semiconductor regions NS of the n-type SOI transistor SN as well as over an upper portion of each of the gate electrode GESp and the source/drain semiconductor regions PS of the p-type SOI transistor SP. In the bulk region 1B, the silicide layer MS is formed over an upper portion of each of the gate electrode GEBn and the source/drain semiconductor regions NB of the n-type bulk transistor BN as well as over an upper portion of each of the gate electrode GEBp and the source/drain semiconductor regions PB of the p-type bulk transistor BP. Furthermore, in the seal ring region 1C, the silicide layer MS is formed over an upper portion of the n-type semiconductor layer NR.

In the above-described process, in the SOI region 1A, the n-type SOI transistor SN having the gate electrode GESn and the source/drain semiconductor regions NS as well as the p-type SOI transistor SP having the gate electrode GESp and the source/drain semiconductor regions PS are formed. Also, in the bulk region 1B, the n-type bulk transistor BN having the gate electrode GEBn and the source/drain semiconductor regions NB as well as the p-type bulk transistor BP having the gate electrode GEBp and the source/drain semiconductor regions PB are formed.

Next, the first interlayer insulating film IL1 is formed over the semiconductor substrate SB so as to cover the SOI region 1A, the bulk region 1B, and the seal ring region 1C, and an upper surface of the first interlayer insulating film IL1 is flattened.

Next, the connection hole CT penetrating through the first interlayer insulating film IL1 is formed. In the SOI region 1A, the connection hole CT reaching the silicide layer MS formed over an upper portion of each of the gate electrode GESn and the source/drain semiconductor regions NS of the n-type SOI transistor SN as well as over an upper portion of each of the gate electrode GESp and the source/drain semiconductor regions PS of the p-type SOI transistor SP is formed. Also, in the bulk region 1B, the connection hole CT reaching the silicide layer MS formed over an upper portion of each of the gate electrode GEBn and the source/drain semiconductor regions NB of the n-type bulk transistor BN as well as over an upper portion of each of the gate electrode GEBp and the source/drain semiconductor regions PB of the p-type bulk transistor BP is formed. Furthermore, in the seal ring region 1C, the connection hole CT reaching the silicide layer MS formed over an upper portion of the n-type semiconductor layer NR is formed.

Next, over the first interlayer insulating film IL1 including the inside of the connection hole CT, a barrier conductor film containing titanium (Ti) and a tungsten (W) film, for example, are formed in order by sputtering, for example. Subsequently, the barrier conductor film and the tungsten (W) film over the first interlayer insulating film IL1 are removed by the chemical mechanical polishing (CMP), for example, and a columnar plug electrode PL comprised of the tungsten (W) film as a main conductor film is formed inside the connection hole CT.

Subsequently, over the first interlayer insulating film IL1 and the plug electrode PL, a metal film such as copper (Cu), aluminum (Al), and the like, for example, is formed, and then, by processing this metal film, the first layer wirings M1 and MR1 electrically connected with the plug electrode PL are formed.

Figure 6:
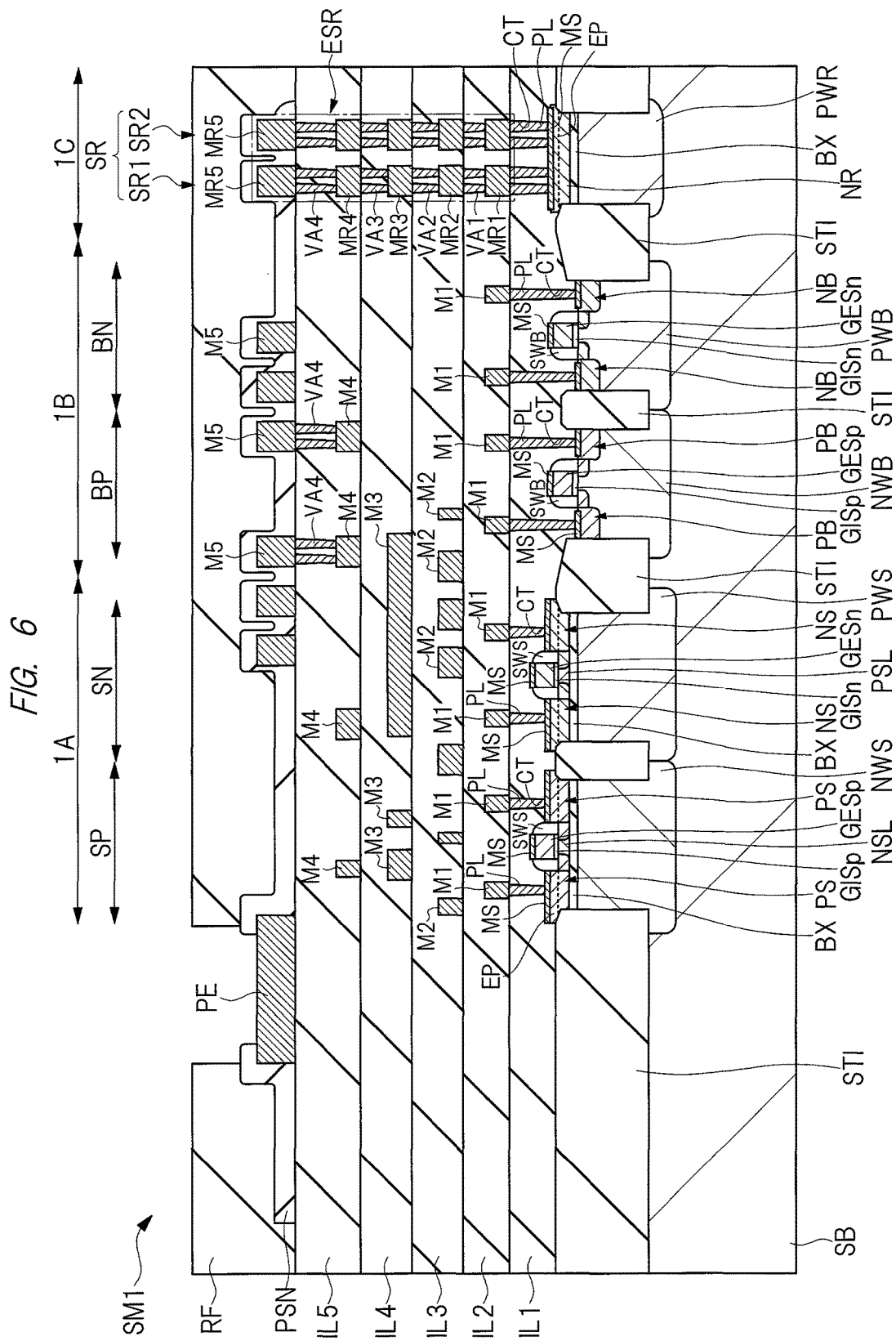
FIG. 6 is a cross-sectional view illustrating the manufacturing process of the semiconductor device continued from FIG. 5.

Next, as illustrated in FIG. 6, the second interlayer insulating film IL2 is formed over the first interlayer insulating film IL1 so as to cover the wirings M1 and MR1, and an upper surface of the second interlayer insulating film IL2 is flattened.

Next, a via hole penetrating through the second interlayer insulating film IL2 and reaching each of the wirings M1 and MR1 is formed. Inside the via hole, the first conductive film VA1 comprised of the tungsten (W) film, for example, as a main conductor film, is then formed. Subsequently, over the second interlayer insulating film IL2, the second layer wirings M2 and MR2 comprised of a metal film and electrically connected with the first conductive film VA1 are formed.

Furthermore, the third interlayer insulating film IL3 is formed over the second interlayer insulating film IL2 so as to cover the wirings M2 and MR2, and a via hole penetrating through the third interlayer insulating film IL3 and reaching each of the wirings M2 and MR2 is formed. Inside the via hole, the second conductive film VA2 comprised of the tungsten (W) film, for example, as a main conductor film, is then formed. Subsequently, over the third interlayer insulating film IL3, the third layer wirings M3 and MR3 comprised of a metal film and electrically connected with the second conductive film VA2 are formed.

Furthermore, the fourth interlayer insulating film IL4 is formed onto the third interlayer insulating film IL3 so as to cover the wirings M3 and MR3, and a via hole penetrating through the fourth interlayer insulating film IL4 and reaching each of the wirings M3 and MR3 is formed. Inside the via hole, the third conductive film VA3 comprised of the tungsten (W) film, for example, as a main conductor film, is then formed. Subsequently, over the fourth interlayer insulating film IL4, the fourth layer wirings M4 and MR4 comprised of a metal film and electrically connected with the third conductive film VA3 are formed.

Furthermore, the fifth interlayer insulating film IL5 is formed over the fourth interlayer insulating film IL4 so as to cover the wirings M4 and MR4, and a via hole which penetrates through the fifth interlayer insulating film IL5 and reaches each of the wirings M4 and MR4 is formed. Inside the via hole, the fourth conductive film VA4 comprised of the tungsten (W) film, for example, as a main conductor film, is formed. Subsequently, over the fifth interlayer insulating film IL5, a pad electrode PE and the fifth layer wirings M5 and MR5 comprised of a metal film and electrically connected with the fourth conductive film VA4 are formed.

In the above-described process, in the SOI region 1A and the bulk region 1B, multilayer wiring is formed. In the seal ring region 1C, the electrode portion ESR of the seal ring SR is formed.

Next, the insulating film PSN made of silicon nitride, for example, is formed so as to cover the wirings M5 and MR5 and the pad electrode PE. Then, the insulating film PSN over the pad electrode PE serving as a connection portion with outside is removed, so that an upper surface of the pad electrode PE is exposed. Subsequently, the protection film RF is formed over the insulating film PSN in such a manner that the upper surface of the pad electrode PE is exposed. The protection film RF is made of photosensitive polyimide and the like, for example.

In the processes described above, the semiconductor device SM1 according to the first embodiment is substantially completed.

Accordingly, according to the first embodiment, since the capacitance comprised of the n-type semiconductor layer NR, the BOX layer BX, and the p-type well PWR is serially connected between the electrode portion ESR of the seal ring SR and the semiconductor substrate SB, the impedance between the electrode portion ESR and the semiconductor substrate SB becomes large, whereby it is possible to suppress the propagation of noise applied to the electrode portion ESR of the seal ring SR to the semiconductor substrate SB.

Modification Example

Hereinafter, a configuration of a semiconductor device according to modification examples (the first to the sixth modification examples) of the first embodiment will be described.

(a) First Modification Example

Figure 7:
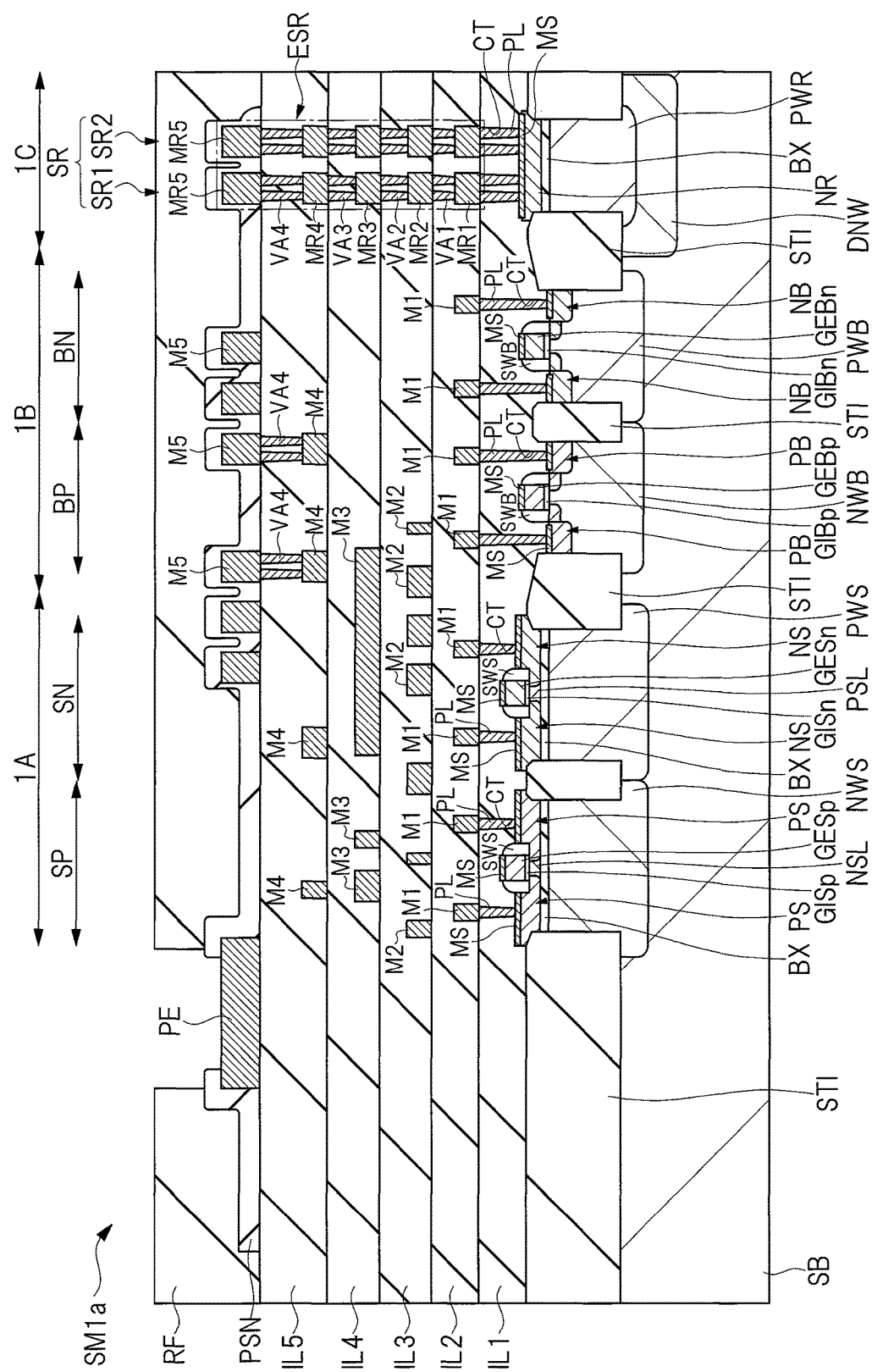
FIG. 7 is a cross-sectional view illustrating a semiconductor device according to a first modification example of the first embodiment.

A configuration of a semiconductor device according to the first modification example of the first embodiment will be described with reference to FIG. 7. FIG. 7 is a cross-sectional view illustrating the semiconductor device according to the first modification example of the first embodiment.

A difference between a semiconductor device SM1a according to a first modification example of the first embodiment and the semiconductor device SM1 described above is a configuration between the electrode portion ESR of the seal ring SR and the semiconductor substrate SB, more particularly, is presence or absence of a buried n-type well DNW between the semiconductor substrate SB and the p-type well PWR.

As illustrated in FIG. 7, in the semiconductor device SM1a, there are the n-type semiconductor layer NR, the BOX layer BX, the p-type well PWR, and the buried n-type well DNW between the electrode portion ESR comprised of the first seal ring electrode SR1 and the second seal ring electrode SR2, and the semiconductor substrate SB. The buried n-type well DNW is formed at a depth deeper than a depth of the p-type well PWR by implanting ions of an n-type impurity into the semiconductor substrate SB, for example, and an impurity concentration of the buried n-type well DNW is set to be higher than an impurity concentration of the semiconductor substrate SB.

Accordingly, a first capacitance comprised of the n-type semiconductor layer NR, the BOX layer BX, and the p-type well PWR, a second capacitance generated by a depletion layer formed at a pn junction portion between the p-type well PWR and the buried n-type well DNW, and a third capacitance generated by a depletion layer formed at a pn junction portion between the buried n-type well DNW and the semiconductor substrate SB are connected in parallel between the electrode portion ESR and the semiconductor substrate SB.

As a result, the capacitance in the seal ring region 1C becomes even smaller than the capacitance in the seal ring region 1C of the semiconductor device SM1, and the impedance between the electrode portion ESR and the semiconductor substrate SB becomes even larger, whereby it is possible to suppress the propagation of noise applied to the electrode portion ESR of the seal ring SR to the semiconductor substrate SB.

(b) Second Modification Example

Figure 8:
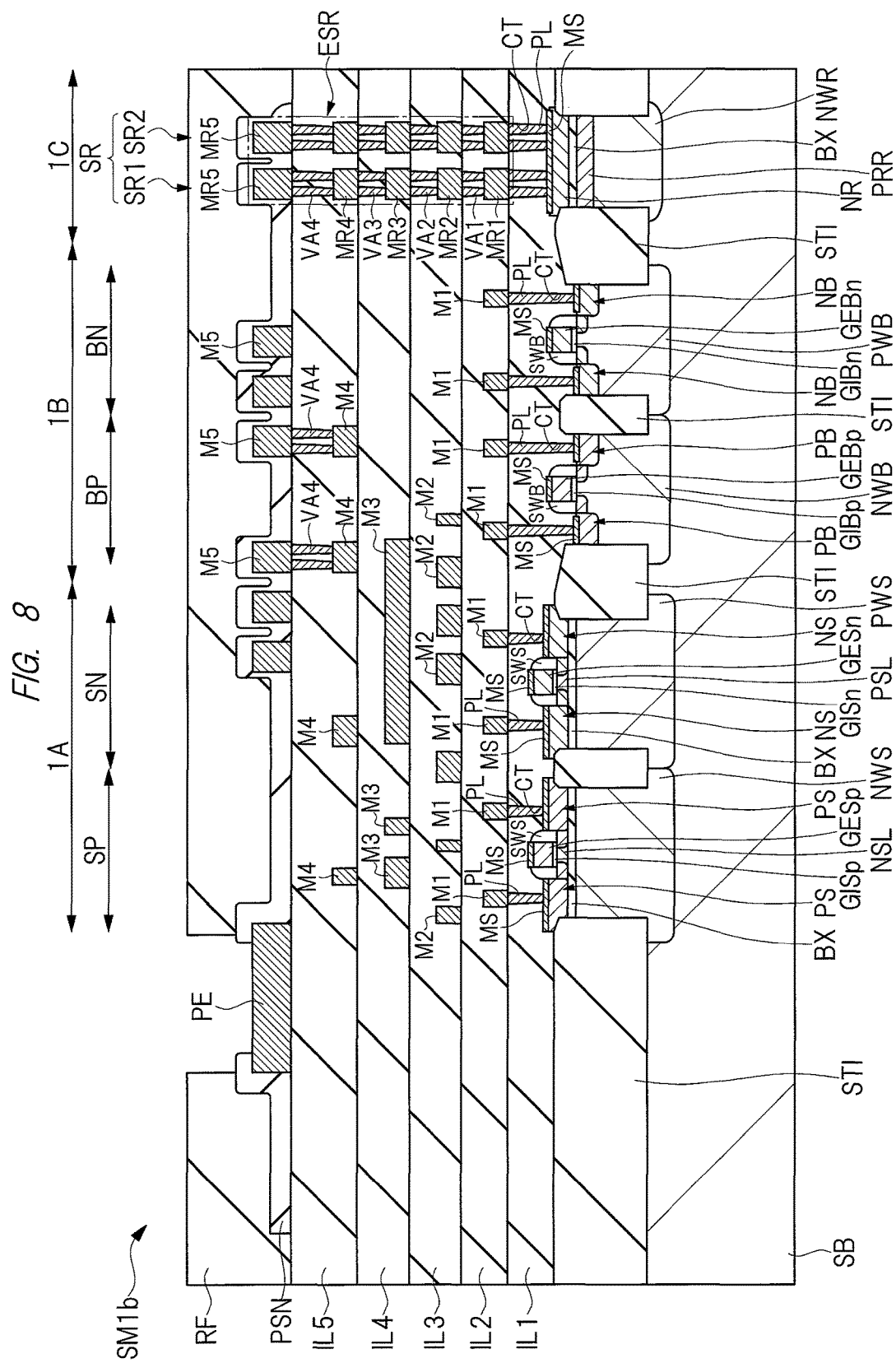
FIG. 8 is a cross-sectional view illustrating a semiconductor device according to a second modification example of the first embodiment.

A configuration of a semiconductor device according to the second modification example of the first embodiment will be described with reference to FIG. 8. FIG. 8 is a cross-sectional view illustrating the semiconductor device according to the second modification example of the first embodiment.

A difference between a semiconductor device SM1b according to a second modification example of the first embodiment and the semiconductor device SM1 described above is the configuration between the electrode portion ESR of the seal ring SR and the semiconductor substrate SB.

As illustrated in FIG. 8, in the semiconductor device SM1b, there are the n-type semiconductor layer NR, the BOX layer BX, a p-type diffusion layer PRR, and an n-type well NWR between the electrode portion ESR comprised of the first seal ring electrode SR1 and the second seal ring electrode SR2, and the semiconductor substrate SB. The n-type well NWR is formed by implanting ions of an n-type impurity into the semiconductor substrate SB, for example. Also, the p-type diffusion layer PRR is formed at a depth shallower than a depth of the n-type well NWR by implanting ions of a p-type impurity into the semiconductor substrate SB, for example, and an impurity concentration of the p-type diffusion layer PRR is set to be higher than impurity concentrations of the n-type well NWR and the semiconductor substrate SB.

Accordingly, a first capacitance comprised of the n-type semiconductor layer NR, the BOX layer BX, and the p-type diffusion layer PRR, a second capacitance generated by a depletion layer formed at a pn junction portion between the p-type diffusion layer PRR and the n-type well NWR, and a third capacitance generated by a depletion layer formed at a pn junction portion between the n-type well NWR and the semiconductor substrate SB are connected in parallel between the electrode electrode portion ESR and the semiconductor substrate SB.

As a result, the capacitance in the seal ring region 1C becomes even smaller than the capacitance therein of the semiconductor device SM1, and the impedance between the electrode portion ESR and the semiconductor substrate SB becomes even larger, whereby it is possible to suppress the propagation of noise applied to the electrode portion ESR of the seal ring SR to the semiconductor substrate SB.

(c) Third Modification Example

Figure 9:
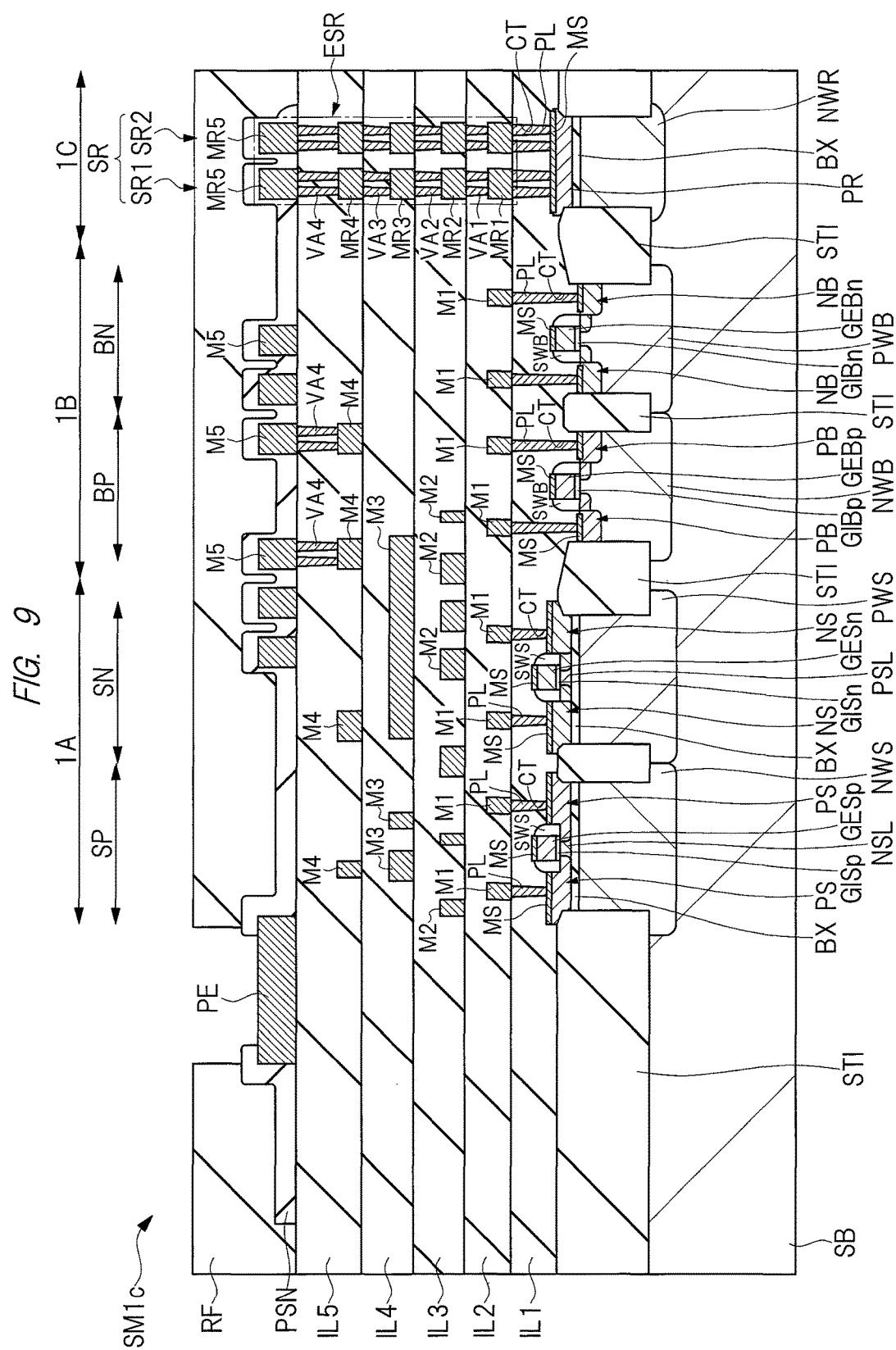
FIG. 9 is a cross-sectional view illustrating a semiconductor device according to a third modification example of the first embodiment.

A configuration of a semiconductor device according to the third modification example of the first embodiment will be described with reference to FIG. 9. FIG. 9 is a cross-sectional view illustrating the semiconductor device according to the third modification example of the first embodiment.

A difference between a semiconductor device SM1c according to a third modification example of the first embodiment and the semiconductor device SM1 described above is the configuration between the electrode portion ESR of the seal ring SR and the semiconductor substrate SB.

As illustrated in FIG. 9, in the semiconductor device SM1c, there are a p-type semiconductor layer PR, the BOX layer BX, and the n-type well NWR between the electrode portion ESR comprised of the first seal ring electrode SR1 and the second seal ring electrode SR2, and the semiconductor substrate SB. The p-type semiconductor layer PR is formed by implanting ions of a p-type impurity into the semiconductor layer SL, for example.

Accordingly, a first capacitance comprised of the p-type semiconductor layer PR, the BOX layer BX, and an n-type well NWR, and a second capacitance generated by a depletion layer formed at a pn junction portion between the n-type well NWR and the semiconductor substrate SB are connected in parallel between the electrode portion ESR and the semiconductor substrate SB.

As a result, the capacitance in the seal ring region 1C becomes even smaller than the capacitance in the seal ring region 1C of the semiconductor device SM1, and the impedance between the electrode portion ESR and the semiconductor substrate SB becomes even larger, whereby it is possible to suppress the propagation of noise applied to the electrode portion ESR of the seal ring SR to the semiconductor substrate SB.

(d) Fourth Modification Example

Figure 10:
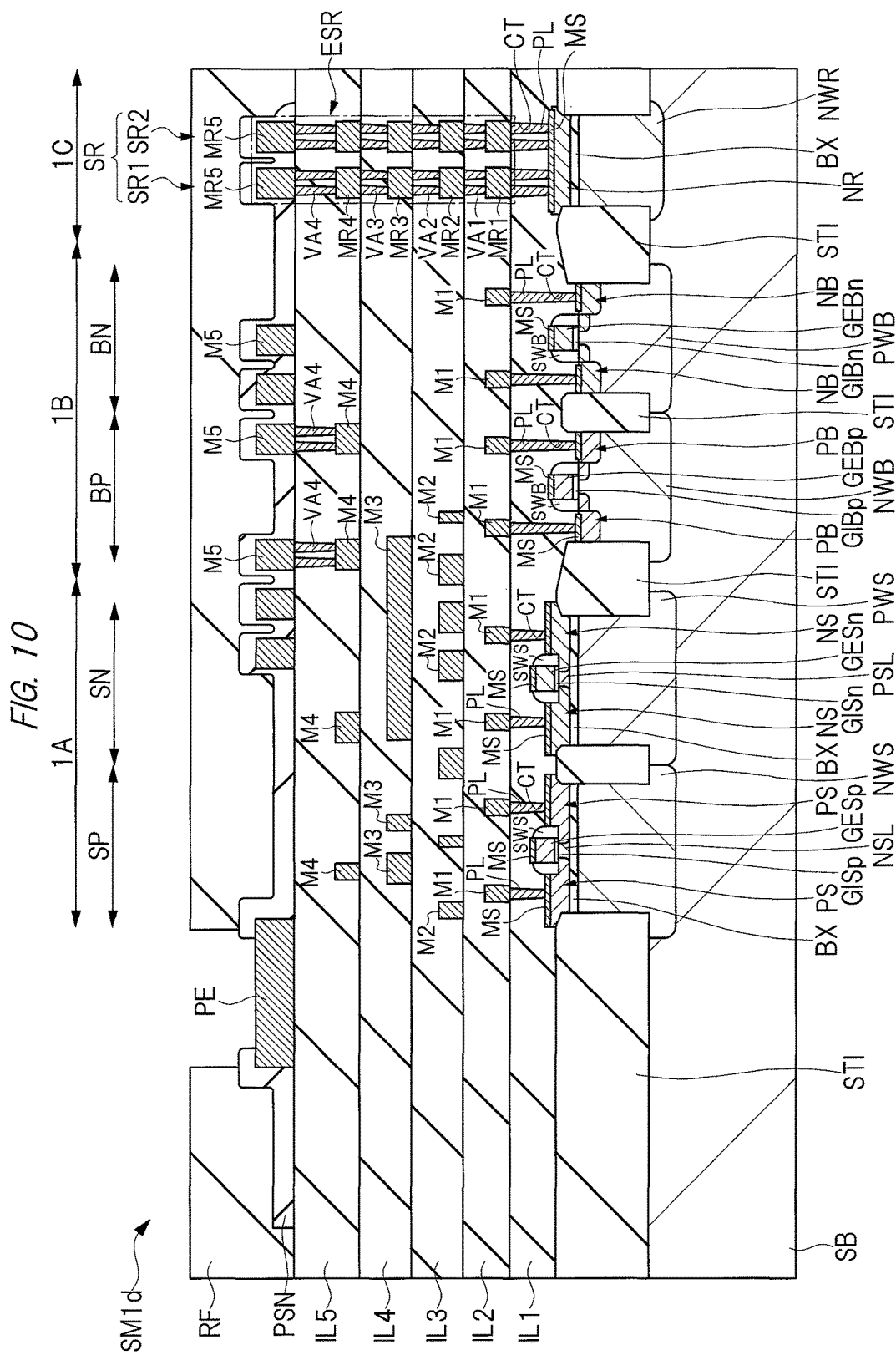
FIG. 10 is a cross-sectional view illustrating a semiconductor device according to a fourth modification example of the first embodiment.

A configuration of a semiconductor device according to the fourth modification example of the first embodiment will be described with reference to FIG. 10. FIG. 10 is a cross-sectional view illustrating the semiconductor device according to the fourth modification example of the first embodiment.

A difference between a semiconductor device SM1d according to a fourth modification example of the first embodiment and the semiconductor device SM1 described above is the configuration between the electrode portion ESR of the seal ring SR and the semiconductor substrate SB.

As illustrated in FIG. 10, in the semiconductor device SM1d, there are the n-type semiconductor layer NR, the BOX layer BX, and the n-type well NWR between the electrode portion ESR comprised of the first seal ring electrode SR1 and the second seal ring electrode SR2, and the semiconductor substrate SB.

Accordingly, a first capacitance comprised of the n-type semiconductor layer NR, the BOX layer BX, and the n-type well NWR, and a second capacitance generated by a depletion layer formed at a pn junction portion between the n-type well NWR and the semiconductor substrate SB are connected in parallel between the electrode portion ESR and the semiconductor substrate SB.

As a result, the capacitance in the seal ring region 1C becomes even smaller than the capacitance in the seal ring region 1C of the semiconductor device SM1, and the impedance between the electrode portion ESR and the semiconductor substrate SB becomes even larger, whereby it is possible to suppress the propagation of noise applied to the electrode portion ESR of the seal ring SR to the semiconductor substrate SB.

(e) Fifth Modification Example

Figure 11:
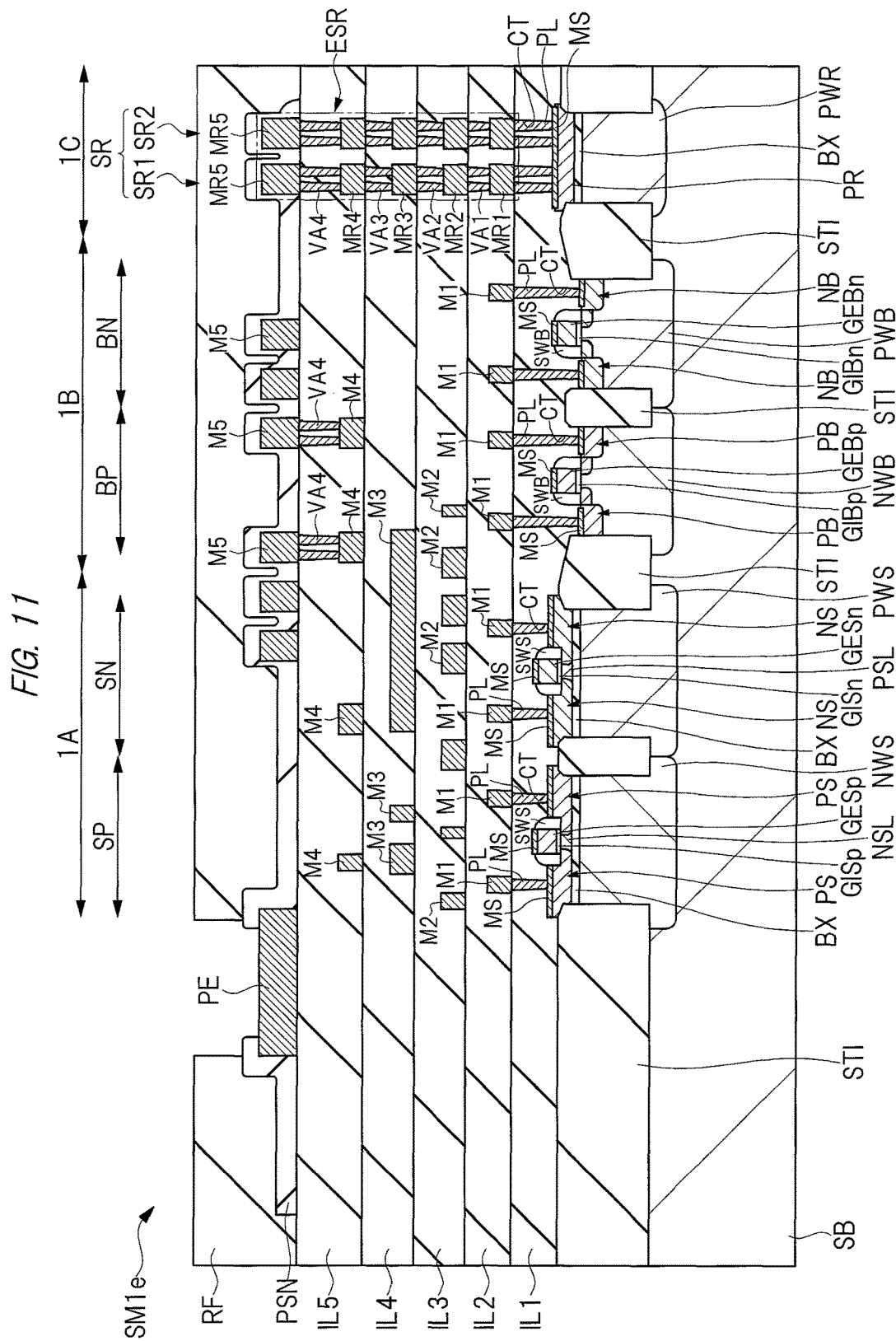
FIG. 11 is a cross-sectional view illustrating a semiconductor device according to a fifth modification example of the first embodiment.

A configuration of a semiconductor device according to the fifth modification example of the first embodiment will be described with reference to FIG. 11. FIG. 11 is a cross-sectional view illustrating the semiconductor device according to the fifth modification example of the first embodiment.

A difference between a semiconductor device SM1e according to a fifth modification example of the first embodiment and the semiconductor device SM1 described above is the configuration between the electrode portion ESR of the seal ring SR and the semiconductor substrate SB.

As illustrated in FIG. 11, in the semiconductor device SM1e, there are the p-type semiconductor layer PR, the BOX layer BX, and the p-type well PWR between the electrode portion ESR comprised of the first seal ring electrode SR1 and the second seal ring electrode SR2, and the semiconductor substrate SB. The p-type semiconductor layer PR is formed by implanting ions of a p-type impurity into the semiconductor layer SL, for example.

Accordingly, a first capacitance comprised of the p-type semiconductor layer PR, the BOX layer BX, and the p-type well PWR is formed between the electrode portion ESR and the semiconductor substrate SB.

As a result, it is possible to obtain the capacitance equal to that of the semiconductor device SM1, whereby it is possible to suppress the propagation of noise applied to the electrode portion ESR of the seal ring SR to the semiconductor substrate SB.

(f) Sixth Modification Example

Figure 12:
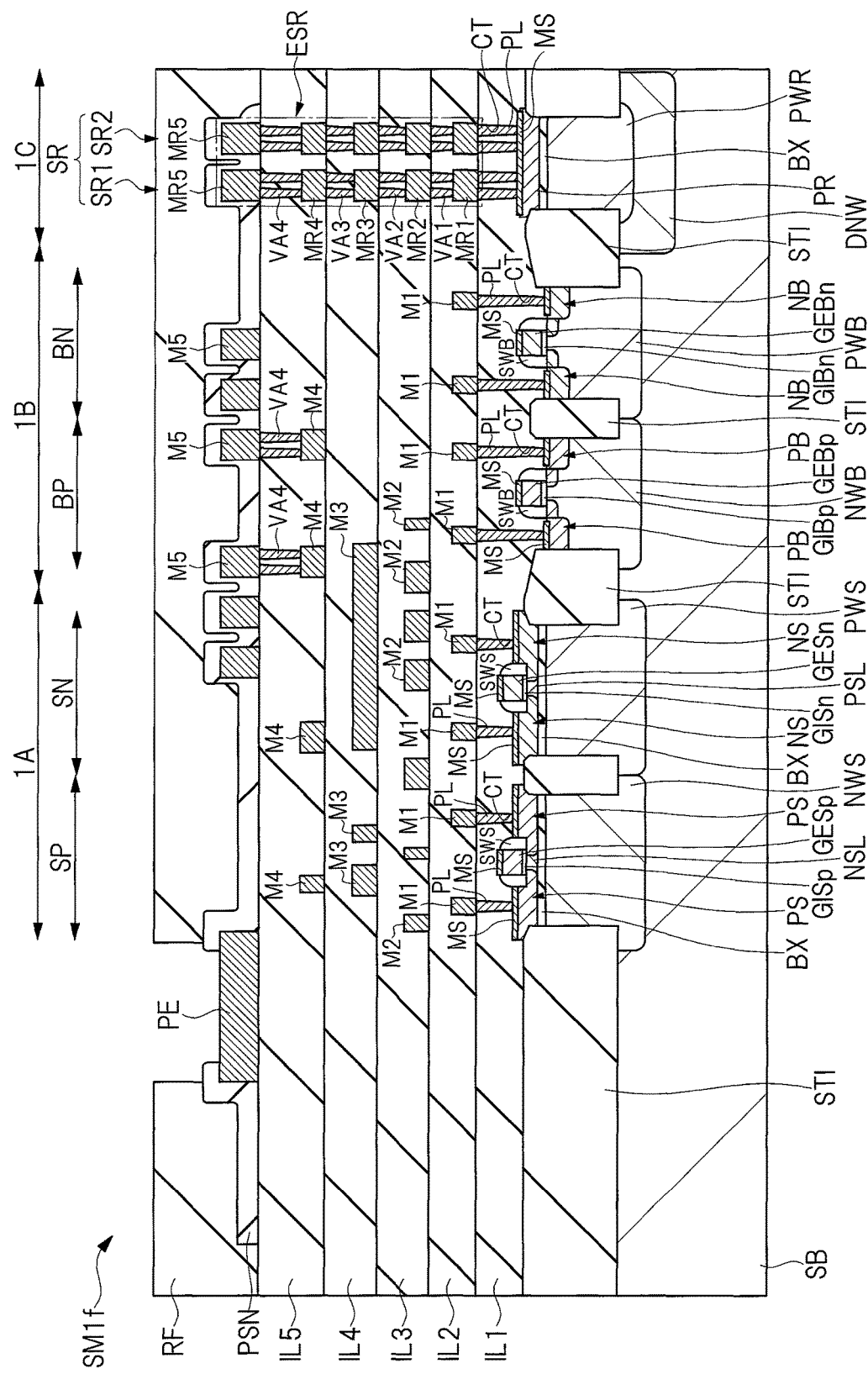
FIG. 12 is a cross-sectional view illustrating a semiconductor device according to a sixth modification example of the first embodiment.

A configuration of a semiconductor device according to the sixth modification example of the first embodiment will be described with reference to FIG. 12. FIG. 12 is a cross-sectional view illustrating the semiconductor device according to the sixth modification example of the first embodiment.

A difference between a semiconductor device SM1f according to a sixth modification example of the first embodiment and the semiconductor device SM1 described above is the configuration between the electrode portion ESR of the seal ring SR and the semiconductor substrate SB.

As illustrated in FIG. 12, in the semiconductor device SM1f, there are the p-type semiconductor layer PR, the BOX layer BX, the p-type well PWR, and the buried n-type well DNW between the electrode portion ESR comprised of the first seal ring electrode SR1 and the second seal ring electrode SR2, and the semiconductor substrate SB. The p-type semiconductor layer PR is formed by implanting ions of a p-type impurity into the semiconductor layer SL, for example. Also, the buried n-type well DNW is formed at a depth deeper than a depth of the p-type well PWR by implanting ions of an n-type impurity into the semiconductor substrate SB, for example, and an impurity concentration of the buried n-type well DNW is set to be higher than an impurity concentration of the semiconductor substrate SB.

Accordingly, a first capacitance comprised of the p-type semiconductor layer PR, the BOX layer BX, and the p-type well PWR, a second capacitance generated by a depletion layer formed at a pn junction portion between the p-type well PWR and the buried n-type well DNW, and a third capacitance generated by a depletion layer formed at a pn junction portion between the buried n-type well DNW and the semiconductor substrate SB are connected in parallel between the electrode portion ESR and the semiconductor substrate SB.

As a result, the capacitance in the seal ring region 1C becomes even smaller than the capacitance in the seal ring region 1C of the semiconductor device SM1, and the impedance between the electrode portion ESR and the semiconductor substrate SB becomes even larger, whereby it is possible to suppress the propagation of noise applied to the electrode portion ESR of the seal ring SR to the semiconductor substrate SB.

Second Embodiment

<Configuration of Semiconductor Device>

Figure 13:
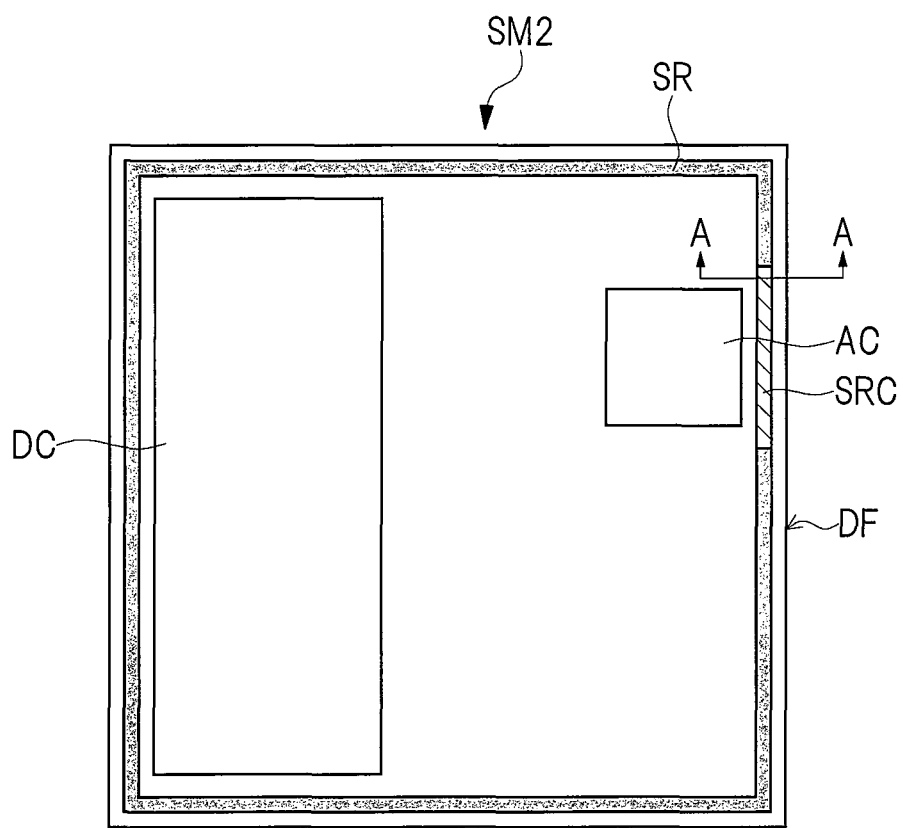
FIG. 13 is a plan view illustrating a semiconductor device according to a second embodiment.
Figure 14:
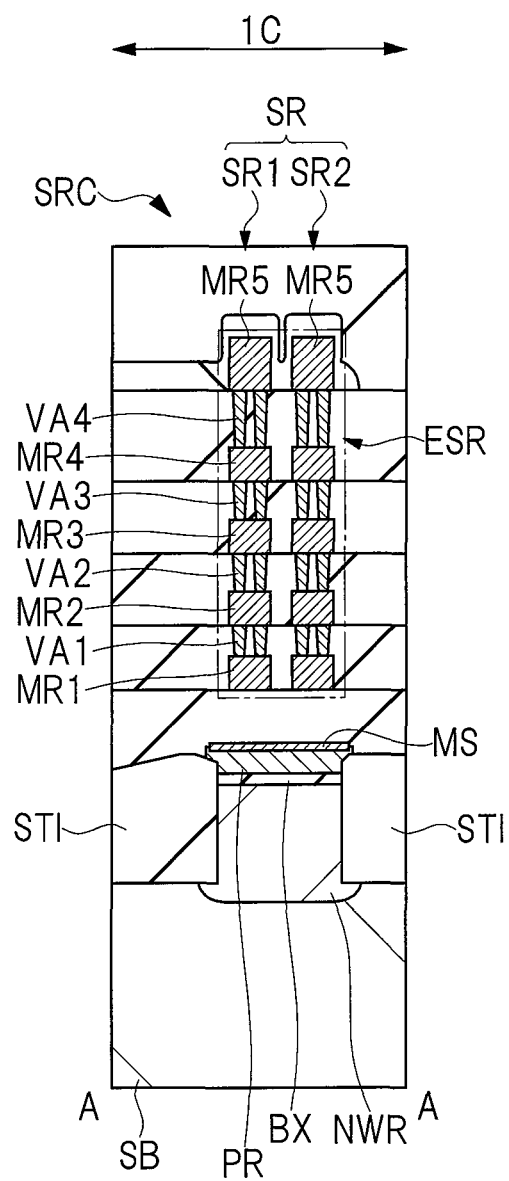
FIG. 14 is a cross-sectional view illustrating a seal ring taken along a line A-A of FIG. 13.

A configuration of a semiconductor device according to a second embodiment will be described with reference to FIGS. 13 and 14. FIG. 13 is a plan view illustrating the semiconductor device according to the second embodiment. FIG. 14 is a cross-sectional view illustrating a seal ring taken along a line A-A of FIG. 13.

As illustrated in FIG. 13, a semiconductor device SM2 according to the second embodiment has a rectangular shape in a plan view and includes a circuit forming region in which a digital circuit unit DC, an analog circuit unit AC, and the like are formed. An annular seal ring SR surrounding the circuit forming region is formed along a dicing surface DF of the semiconductor device SM2.

The seal ring SR uses the structure illustrated in the third modification example of the first embodiment described above, for example (see FIG. 9). That is, as illustrated in FIG. 9, the seal ring SR is comprised of the electrode portion ESR in which the first layer wiring MR1 to the fifth layer wiring MR5 are connected, the p-type semiconductor layer PR, the BOX layer BX, and the n-type well NWR. The electrode portion ESR is electrically connected with the p-type semiconductor layer PR through the plug electrode PL buried inside the connection hole CT penetrating through the first interlayer insulating film IL1, and through the silicide layer MS.

Note that the structure of the seal ring SR is not limited to this, and it is also possible to use the seal ring SR according to the first embodiment described above (see FIG. 1) or the seal ring SR according to the first, second, fourth, fifth, or sixth modification example (see FIG. 7, 8, 10, 11, or 12), for example.

As illustrated in FIG. 14, however, the plug electrode PL is not formed in a part SRC of the seal ring SR disposed near a circuit susceptible to noise such as the analog circuit unit AC, for example. In this way, by forming the part SRC where the electrode portion ESR and the p-type semiconductor layer PR are not connected by the plug electrode PL, it is possible to increase resistance, thereby increasing impedance. Thus, in the part SRC, it is possible to prevent noise applied to the seal ring SR from being propagated to the semiconductor substrate SB.

Note that, since deterioration of reliability such as water resistance is concerned as a result of not forming the plug electrode PL, the part SRC where the plug electrode PL is not formed is disposed only near the circuit susceptible to noise such as the analog circuit unit AC.

Third Embodiment

<Configuration of Semiconductor Device>

Figure 15:
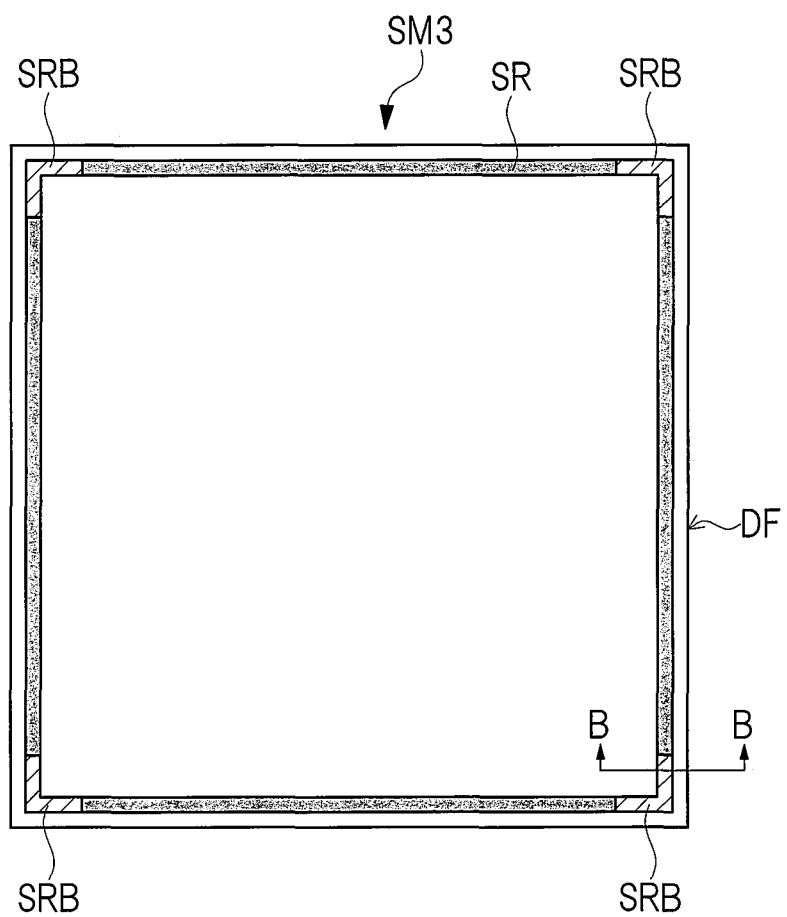
FIG. 15 is a plan view illustrating a semiconductor device according to a third embodiment.
Figure 16:
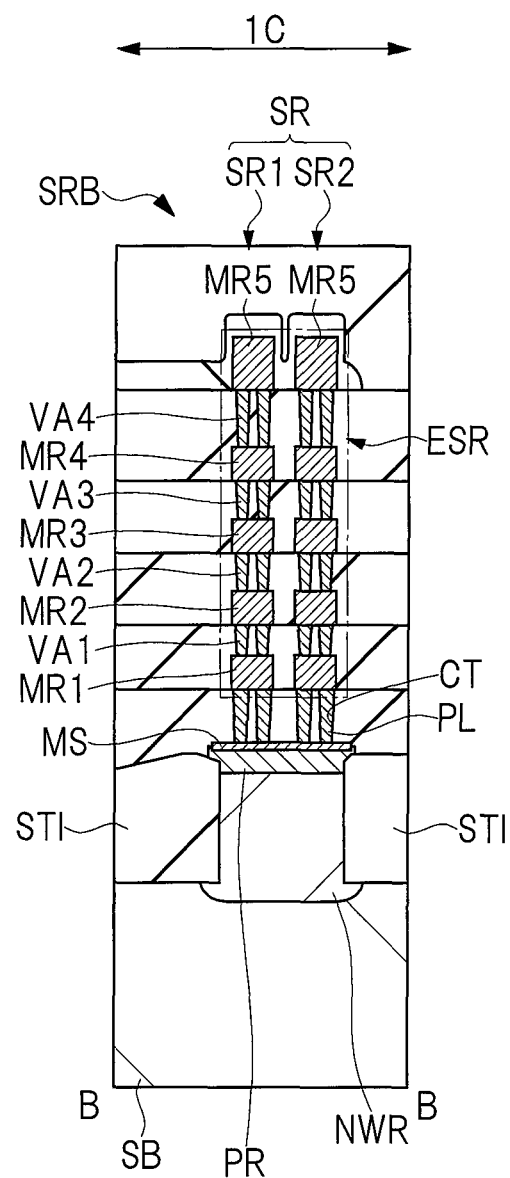
FIG. 16 is a cross-sectional view illustrating a seal ring taken along a line B-B of FIG. 15.

A configuration of a semiconductor device according to a third embodiment will be described with reference to FIGS. 15 and 16. FIG. 15 is a plan view illustrating the semiconductor device according to the third embodiment. FIG. 16 is a cross-sectional view illustrating a seal ring taken along a line B-B of FIG. 15.

As illustrated in FIG. 15, a semiconductor device SM3 according to the third embodiment has a rectangular shape in a plan view, and an annular seal ring SR surrounding a circuit forming region is formed along a dicing surface DF of the semiconductor device SM3.

The seal ring SR uses the structure illustrated in the third modification example of the first embodiment described above, for example (see FIG. 9). That is, as illustrated in FIG. 9, the seal ring SR is comprised of the electrode portion ESR in which the first layer wiring MR1 to the fifth layer wiring MR5 are connected, the p-type semiconductor layer PR, the BOX layer BX, and the n-type well NWR. The electrode portion ESR is electrically connected with the p-type semiconductor layer PR through the plug electrode PL buried inside the connection hole CT penetrating through the first interlayer insulating film IL1, and through the silicide layer MS.

Note that the structure of the seal ring SR is not limited to this, and it is also possible to use the seal ring SR according to the first embodiment described above (see FIG. 1) or the seal ring SR according to the first, second, fourth, fifth, or sixth modification example (see FIG. 7, 8, 10, 11, or 12), for example.

As illustrated in FIG. 16, however, the BOX layer BX is not formed in a part SRB of the seal ring SR near each of four corners of the semiconductor device SM3.

In manufacturing the semiconductor device SM3, electric charges are stored in the BOX layer BX, and a potential difference increases between an electrode portion ESR side and a semiconductor substrate SB side interposing the BOX layer BX, whereby there is a risk of destruction of the BOX layer BX. In the third embodiment, however, by allowing the electric charges stored in the BOX layer BX to flow into the semiconductor substrate SB through the part SRB of the seal ring SR where the BOX layer BX is not formed, the electric charges are hardly stored in the BOX layer BX, whereby it is possible to prevent the destruction of the BOX layer BX.

Note that, since decrease in impedance is concerned as a result of not forming the BOX layer BX, in the third embodiment, the part SRB where the BOX layer BX is not formed is formed to a part near each of the four corners of the semiconductor device SM3.

Also, in the third embodiment, the part SRB where the BOX layer BX is not formed is formed to a part near each of the four corners of the semiconductor device SM3; however, it is also possible to form the part SRB to a part near one corner or each of two or three corners thereof, for example. Moreover, not limited to the corners, the part SRB may also be formed to a part in parallel with the dicing surface DF and apart from the analog circuit unit AC susceptible to noise.

Fourth Embodiment

<Configuration of Semiconductor Device>

Figure 17:
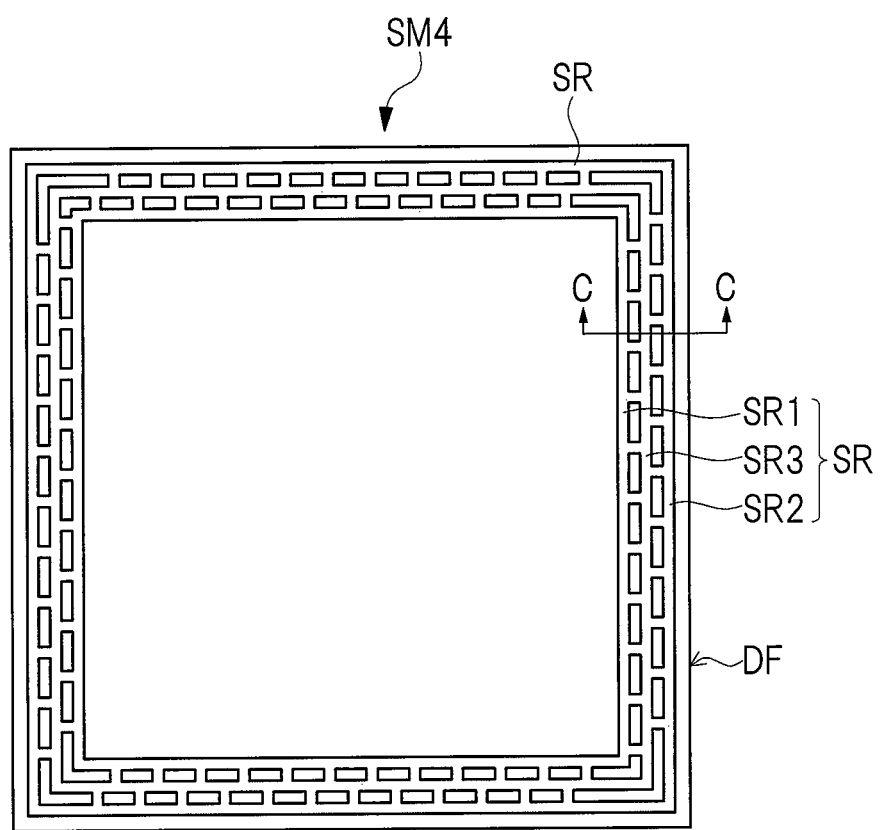
FIG. 17 is a plan view illustrating a semiconductor device according to a fourth embodiment.
Figure 18:
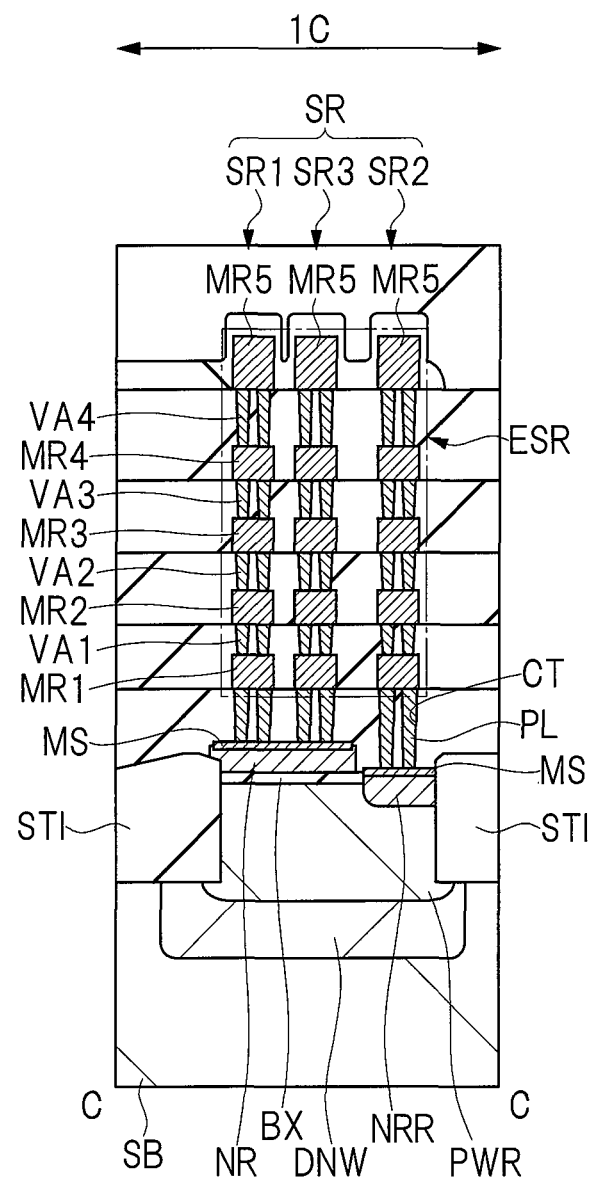
FIG. 18 is a cross-sectional view illustrating a seal ring taken along a line C-C of FIG. 17.

A configuration of a semiconductor device according to a fourth embodiment will be described with reference to FIGS. 17 and 18. FIG. 17 is a plan view illustrating the semiconductor device according to the fourth embodiment. FIG. 18 is a cross-sectional view illustrating a seal ring taken along a line C-C of FIG. 17.

For example, the seal ring SR according to the first embodiment described above has the annular structure in which the circuit forming region is dually surrounded by the annular first seal ring electrode SR1 disposed inside (on the circuit forming region side) in a plan view and the annular second seal ring electrode SR2 disposed outside (on the opposite side of the circuit forming region) in a plan view.

As illustrated in FIG. 17, a semiconductor device SM4 according to the fourth embodiment has a rectangular shape in a plan view, and an annular seal ring SR surrounding a circuit forming region is formed along a dicing surface DF of the semiconductor device SM4.

The seal ring SR according to the fourth embodiment, however, has an annular structure in which the circuit forming region is triply surrounded, as illustrated in FIGS. 17 and 18, by an annular first seal ring electrode SR1 disposed inside, an annular second seal ring electrode SR2 disposed outside, and an annular third seal ring electrode SR3 disposed between the first seal ring electrode SR1 and the second seal ring electrode SR2.

A first part of the seal ring where the first seal ring electrode SR1 and the third seal ring electrode SR3 are formed uses the structure illustrated in the first modification example of the first embodiment described above, for example (see FIG. 7). That is, as illustrated in FIG. 7, the first part of the seal ring SR is comprised of the first seal ring electrode SR1, a third seal ring electrode SR3, the n-type semiconductor layer NR, the BOX layer BX, the p-type well PWR, and the buried n-type well DNW. Then, the first seal ring electrode SR1 and the third seal ring electrode SR3 are electrically connected with the n-type semiconductor layer NR through the plug electrode PL buried inside the connection hole CT penetrating through the first interlayer insulating film IL1, and through the silicide layer MS.

Note that the structure of the first part of the seal ring SR is not limited to this, and it is also possible to use the seal ring SR according to the first embodiment described above (see FIG. 1) or the seal ring SR according to the second, third, fourth, fifth, or sixth modification example (see FIG. 8, 9, 10, 11, or 12), for example.

A second part of the seal ring where the second seal ring electrode SR2 is formed, however, is comprised of an n-type diffusion layer NRR, the p-type well PWR, and the buried n-type well DNW. The second seal ring electrode SR2 is electrically connected with the n-type diffusion layer NRR through the plug electrode PL buried inside the connection hole CT penetrating through the first interlayer insulating film IL1, and through the silicide layer MS. That is, the BOX layer BX is not formed between the second seal ring electrode SR2 and the semiconductor substrate SB.

In manufacturing the semiconductor device SM4, electric charges are stored in the BOX layer BX, and a potential difference increases between an electrode portion ESR side and a semiconductor substrate SB side interposing the BOX layer BX, whereby there is a risk of destruction of the BOX layer BX. In the fourth embodiment, however, by allowing the electric charges stored in the BOX layer BX to flow into the semiconductor substrate SB through the second part where the BOX layer BX is not formed, the electric charges are hardly stored in the BOX layer BX, whereby it is possible to prevent the destruction of the BOX layer BX.

Modification Example

Figure 19:
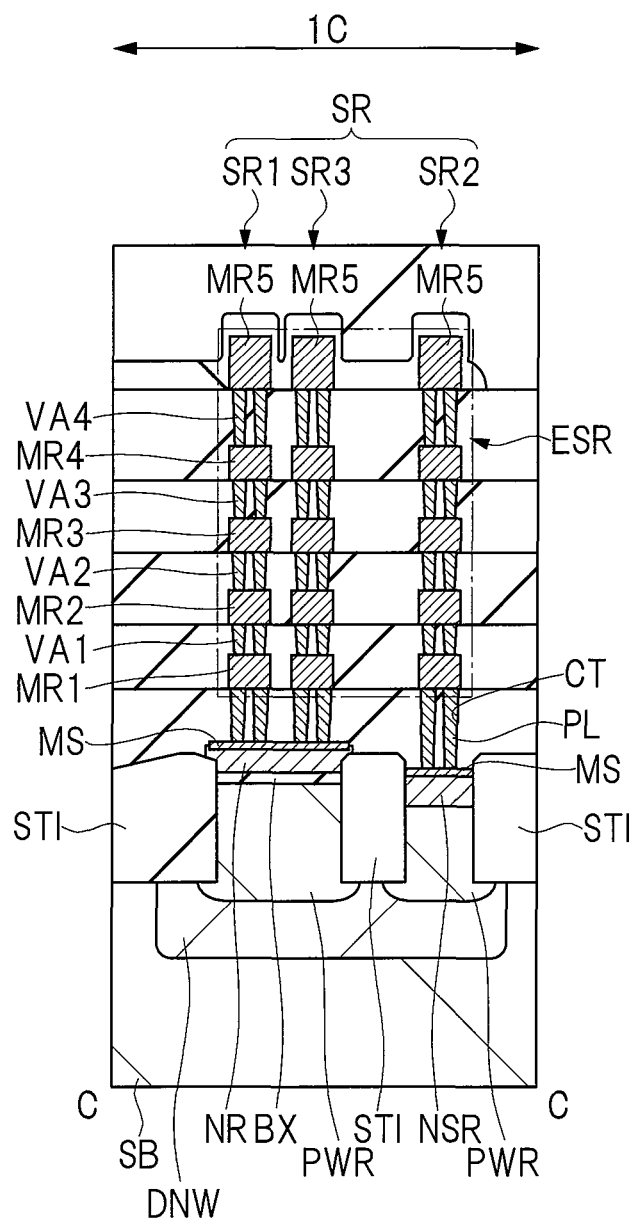
FIG. 19 is a cross-sectional view illustrating a seal ring according to a modification example of the fourth embodiment.

A configuration of a semiconductor device according to a modification example of the fourth embodiment will be described with reference to FIG. 19. FIG. 19 is a cross-sectional view illustrating a seal ring according to the modification example of the fourth embodiment.

As illustrated in FIG. 19, it is also possible to form an element isolation portion STI between the first part where the BOX layer BX is formed and the second part where the BOX layer BX is not formed. Even with this structure, it is possible to allow the electric charges stored in the BOX layer BX to flow into the semiconductor substrate SB through the second part where the BOX layer BX is not formed, whereby the electric charges are hardly stored in the BOX layer BX, and it is possible to prevent the destruction of the BOX layer BX.

In the foregoing, the invention made by the inventors of the present invention has been concretely described based on the embodiments. However, it is needless to say that the present invention is not limited to the foregoing embodi-

What is claimed is:

1. A semiconductor device comprising:
a first region;
a second region surrounding an outer periphery of the first region; and
an annular seal ring formed in the second region,
wherein the second region includes:
an SOI substrate comprised of a semiconductor substrate of a first conductivity type, a buried insulating film over the semiconductor substrate, and a semiconductor layer over the buried insulating film; and
an interlayer insulating film formed over the semiconductor layer,
wherein the seal ring includes:
an annular electrode portion comprised of a conductive film buried in the interlayer insulating film;
the semiconductor layer; and
the buried insulating film, and
wherein the electrode portion is electrically connected with the semiconductor layer,
wherein an element isolation portion is formed in the semiconductor substrate between the first region and the second region, and the element isolation portion is thicker than the buried insulating film, and
wherein the semiconductor substrate under the buried insulating film has more than one PN junction portion.

2. The semiconductor device according to claim 1, wherein a silicide layer is formed over a surface layer portion of the semiconductor layer.

3. The semiconductor device according to claim 1,
wherein the seal ring further includes a first well formed in the semiconductor substrate and having a first depth from an interface between the semiconductor substrate and the buried insulating film,
wherein the semiconductor layer is of a second conductivity type different from the first conductivity type,
wherein the first well is of the first conductivity type, and
wherein the seal ring further includes a first buried well of the second conductivity type surrounding a bottom surface of the first well.

4. The semiconductor device according to claim 1, wherein the seal ring further includes:
a second well formed in the semiconductor substrate and having a second depth from an interface between the semiconductor substrate and the buried insulating film; and
a semiconductor region formed in the semiconductor substrate and having a third depth shallower than the second depth from the interface between the semiconductor substrate and the buried insulating film,
wherein the semiconductor layer and the second well are of the second conductivity type different from the first conductivity type, and
wherein the semiconductor region is of the first conductivity type.

5. The semiconductor device according to claim 1,
wherein the seal ring further includes a third well formed in the semiconductor substrate and having a fourth depth from an interface between the semiconductor substrate and the buried insulating film,
wherein the semiconductor layer is of the first conductivity type, and
wherein the third well is of the second conductivity type different from the first conductivity type.

6. The semiconductor device according to claim 1,
wherein the seal ring further includes a fourth well formed in the semiconductor substrate and having a fifth depth from an interface between the semiconductor substrate and the buried insulating film, and
wherein the semiconductor layer and the fourth well are of the second conductivity type different from the first conductivity type.

7. The semiconductor device according to claim 1,
wherein the seal ring further includes a fifth well formed in the semiconductor substrate and having a sixth depth from an interface between the semiconductor substrate and the buried insulating film,
wherein the semiconductor layer and the fifth well are of the first conductivity type, and
wherein the seal ring further includes a second buried well of the second conductivity type different from the first conductivity type, the second buried well surrounding a bottom surface of the fifth well.

8. The semiconductor device according to claim 1, wherein the electrode portion is not connected with the semiconductor layer in a part of the seal ring.

9. The semiconductor device according to claim 1,
wherein an analog circuit is formed in the first region, and
wherein the electrode portion is not connected with the semiconductor layer in a part of the seal ring near the analog circuit.

10. The semiconductor device according to claim 1, wherein the buried insulating film is not formed, and the semiconductor layer is connected with the semiconductor substrate in a part of the seal ring.

11. The semiconductor device according to claim 1,
wherein the semiconductor substrate has a rectangular shape in a plan view,
wherein the seal ring is formed along a periphery of the semiconductor substrate, and
wherein the buried insulating film is not formed, and the semiconductor layer is connected with the semiconductor substrate in a part of the seal ring near a corner portion of the semiconductor substrate.

12. The semiconductor device according to claim 1, wherein the electrode portion is comprised of:
an annular first seal ring electrode formed on a side of the first region;
an annular second seal ring electrode formed on an opposite side to the first region and apart from the first seal ring electrode; and
an annular third seal ring electrode formed between the first seal ring electrode and the second seal ring electrode and apart from the first seal ring electrode and the second seal ring electrode, and
wherein the buried insulating film is disposed directly below the first seal ring electrode and the third seal ring electrode, and the buried insulating film is not disposed directly below the second seal ring electrode.

13. The semiconductor device according to claim 12,
wherein the first seal ring electrode and the third seal ring electrode are connected with a first silicide layer formed over a surface layer portion of the semiconductor layer over the buried insulating film, and
wherein the second seal ring electrode is connected with a second silicide layer formed over a surface layer portion of the semiconductor substrate.

14. The semiconductor device according to claim 12, wherein the element isolation portion is formed between a region where the first seal ring electrode and the third seal ring electrode are formed and a region where the second seal ring electrode is formed.

\* \* \* \* \*